(12) United States Patent
Kurosaki et al.

(10) Patent No.: US 6,841,825 B2
(45) Date of Patent: Jan. 11, 2005

(54) SEMICONDUCTOR DEVICE

(75) Inventors: Toru Kurosaki, Saitama (JP); Hiroaki Shishido, Saitama (JP); Mizue Kitada, Saitama (JP); Shinji Kunori, Saitama (JP); Kosuke Ohshima, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/449,002

(22) Filed: Jun. 2, 2003

(65) Prior Publication Data

US 2003/0227051 A1 Dec. 11, 2003

(30) Foreign Application Priority Data

| Jun. 5, 2002 | (JP) | ........................... 2002-163965 |
| Oct. 4, 2002 | (JP) | ........................... 2002-291841 |
| May 12, 2003 | (JP) | ........................... 2003-132503 |

(51) Int. Cl.[7] ............................................ H01L 27/108
(52) U.S. Cl. .................. 257/330; 257/330; 257/331; 257/332; 257/401; 438/259; 438/270; 438/271; 438/589
(58) Field of Search ................................ 257/330, 331, 257/332, 401; 438/259, 270, 271, 589

(56) References Cited

U.S. PATENT DOCUMENTS

| 3,335,296 A | 8/1967 | Smart |
| 3,391,287 A | 7/1968 | Kao et al. |
| 3,541,403 A | 11/1970 | Lepselter et al. |
| 4,754,310 A | 6/1988 | Coe |
| 5,081,509 A | 1/1992 | Kozaka et al. |
| 5,148,241 A * | 9/1992 | Sugita ........................... 257/44 |
| 5,216,275 A | 6/1993 | Chen |
| 5,241,195 A | 8/1993 | Tu et al. |
| 5,438,215 A | 8/1995 | Tihanyi |
| 5,801,417 A * | 9/1998 | Tsang et al. ................. 257/333 |
| 5,883,411 A | 3/1999 | Ueda et al. |
| 6,124,612 A * | 9/2000 | Tihanyi et al. .............. 257/330 |
| 6,184,545 B1 | 2/2001 | Werner et al. |
| 6,204,097 B1 | 3/2001 | Shen et al. |
| 6,404,032 B1 | 6/2002 | Kitada et al. |
| 6,573,559 B2 | 6/2003 | Kitada et al. |
| 6,621,132 B2 * | 9/2003 | Onishi et al. ................ 257/409 |
| 6,693,011 B2 * | 2/2004 | Wahl et al. .................. 438/270 |
| 2003/0042555 A1 | 3/2003 | Kitada et al. |
| 2003/0160262 A1 | 8/2003 | Kitada et al. |
| 2003/0203576 A1 | 10/2003 | Kitada et al. |

FOREIGN PATENT DOCUMENTS

| EP | 1 130 653 A2 | 9/2001 |
| EP | 1 139 433 A1 | 10/2001 |
| EP | 1 289 022 A2 | 3/2003 |
| EP | 1 339 105 A2 | 8/2003 |
| EP | 1 341 238 A2 | 9/2003 |
| JP | 2001-244462 A | 9/2001 |
| JP | 2001-284604 | 12/2001 |
| JP | 2003-69017 A | 3/2003 |
| JP | 2003-243671 A | 3/2003 |
| JP | 2003-258270 A | 9/2003 |

* cited by examiner

*Primary Examiner*—Allan R. Wilson
*Assistant Examiner*—Edgardo Ortiz
(74) *Attorney, Agent, or Firm*—Armstrong, Kratz, Quintos, Hanson & Brooks, LLP.

(57) ABSTRACT

A technique for improving a ruggedness of a transistor against breakdown is provided. In a transistor of the present invention, a height of filling regions is higher than that of buried regions, so that a withstanding voltage of the filling regions is higher than that of the buried regions. Therefore, since avalanche breakdown occurs in an active region, causing an avalanche breakdown current to flow through the active region having a large area, current concentration does not occur. As a result, a ruggedness of an element against breakdown is increased.

10 Claims, 15 Drawing Sheets

SEMICONDUCTOR DEVICE

BACKGROUND OF THE INVENTION

1. Field of the Invention

The present invention relates to semiconductor devices, in particular to a transistor and a diode, each having a structure in which semiconductor crystal is epitaxially grown.

2. Description of the Related Art

FIG. 32 is a sectional view of a conventional transistor 101, showing a cross section of a processed substrate taken along a plane across a source region described below and parallel to a surface of the substrate. FIG. 33(a) is a sectional view taken along the line X—X in FIG. 32, and FIG. 33(b) is a sectional view taken along the line Y—Y in FIG. 32.

This transistor 101 is a trench type power MOSFET including a single crystal substrate 111 and a drain layer 112. The single crystal substrate 111 is made of silicon single crystal doped with an $N^+$-type impurity at a high concentration. The drain layer 112 is made of an $N^-$-type silicon epitaxial layer that is formed by epitaxial growth on the single crystal substrate 111. The reference numeral 110 denotes a processed substrate having the single crystal substrate 111 and the drain layer 112.

The surface of the processed substrate 110 is etched so that rectangular ring-shaped hole is formed thereon.

P-type base region 133 is formed on the surface of the processed substrate 110 inside the inner circumference of the ring-shaped hole. In the vicinity of the surfaces within the base region 133, a plurality of $P^+$-type ohmic regions 165, and $N^+$-type source regions 166 are respectively formed.

At the position between the source regions 166, the surface of the processed substrate 110 is etched strip shape to form narrow grooves.

On the bottoms of the narrow grooves and the above-described ring-shaped hole, buried portions 126a and 126b made of a semiconductor filler having an opposite conductivity type to that of the drain layer 112 are respectively formed. An upper end of each of the buried portions 126a and 126b is situated below the boundary between the base region 133 and the drain layer 112. The formation of the buried portions 126a and 126b make the depths of the narrow grooves and the ring-shaped hole shallow, respectively.

A gate insulating film 157 is formed on the inner surface of each of the narrow grooves and the ring-shaped hole now having a shallow depth. The narrow grooves and the ring-shaped hole is filled with polysilicon while polysilicon is being insulated from the processed substrate 110 by the gate insulating films 157. Gate electrode plugs 155a and 155b are formed by the thus filling polysilicon, respectively.

The gate electrode plugs 155a and 155b are connected to each other through a gate electrode film made of a metal thin film not shown in the drawing.

On the surfaces of the source regions 166 and the ohmic regions 165, a source electrode film 167 made of a metal thin film is formed. Interlayer insulating films 163 are formed on the gate electrode plugs 155a and 155b. The interlayer insulating films 163 electrically insulate the source electrode film 167 and the gate electrode plugs 155a and 155b from each other.

A plurality of rectangular ring-shaped guard ring portions $125_1$ to $125_3$ are provided in a region outside the ring-shaped hole provided on the processed substrate 110. Each of the guard ring portions $125_1$ to $125_3$ is formed by diffusion of a p-type impurity having an opposite conductivity type to that of the drain layer 112 into the surface of the processed substrate 110. The guard ring portions $125_1$ to $125_3$ are concentrically provided.

On the back surface of the processed substrate 110, i.e. on the surface of the single crystal substrate 111, a drain electrode film 170 is formed.

In the thus formed transistor 101, the source electrode film 167 is connected to a ground potential while a positive voltage is applied to the drain electrode film 170. In such a state, a positive voltage equal to or higher than a threshold voltage is applied to each of the gate electrode plugs 155a and 155b, an n-type inversion layer is formed in a channel region (corresponding to an interface between the base region 133 and the gate insulating film 157). Then, the source regions 166 and the drain layer 112 are connected to each other through the inversion layer, so that a current is allowed to flow from the drain layer 112 to the source regions 166. In such a condition, the transistor 101 is in a conductive state.

When the potential of each of the gate electrode plugs 155a and 155b is put at the same potential as a source potential in such a state, the inversion layer disappears so that current is not passed. In this condition, the transistor 101 is in a cutoff state.

In the state where the transistor 101 is in a cutoff state and a large voltage is applied between the drain electrode film 170 and the source electrode film 167, PN junctions formed between the base regions 133 and the drain layer 112 are reverse biased, a depletion layer expanded into the p-type base regions 133 and the n-type drain layer 112. When edges of the expanded depletion layer are in contact with the buried portions 126a and 126b placed below the respective gate electrode plugs 155a and 155b and the respective guard ring-shaped portions $125_1$ to $125_3$, the base regions 133 and the buried portions 126a and 126b are connected to each other through the depletion layer. At the same time, the base regions 133 and the guard ring-shaped portions $125_1$ to $125_3$ are connected to each other through the depletion layer. In this manner, the potential of each of the buried portions 126a and 126b and the guard ring-shaped portions $125_1$ to $125_3$, which has been at a floating potential, is stabilized. As a result, the depletion layer is also expanded into the drain layer 112 from each of the buried portions 126a and 126b and the guard ring-shaped portions $125_1$ to $125_3$.

Each of the guard ring-shaped portions $125_1$ to $125_3$ is formed by diffusion. Therefore, if each of the guard ring-shaped portions $125_1$ to $125_3$ is intended to be deeply formed so as to increase a withstanding voltage, its width is also correspondingly increased. As a result, the area of an element is increased.

On the other hand, if each of the guard ring-shaped portions $125_1$ to $125_3$ is formed shallowly, breakdown occurs not at the PN junction between each of the buried portions 126a and 126b and the drain layer 112 but at the PN junction between each of the guard ring-shaped portions $125_1$ to $125_3$ and the drain layer 112 when a reverse bias at a high voltage is applied thereon.

Since the area of the PN junction between each of the guard ring-shaped portions $125_1$ to $125_3$ and the drain layer 112 is smaller than that of the PN junction between each of the buried portions 126a and 126b and the drain layer 112, there arises a problem in that a breakdown current flowing through such a small area is likely to break down an element.

SUMMARY OF THE INVENTION

The present invention is directed to a solution to the above-described disadvantage associated with the conventional device, and it is an object of the invention to provide a semiconductor device with a low resistance and high withstanding voltage.

The present invention provides a transistor comprising a processed substrate including a drain layer of a first conductivity type provided on one face thereof, the processed substrate having a plurality of first deep holes provided on the drain layer side and a plurality of ring-shaped second deep holes provided so as to concentrically surround the plurality of first deep holes, a gate insulating film provided on at least a part of a side face of each of the first deep holes, gate electrode plugs provided in the first deep holes and being in contact with the gate insulating film, a base region of a second conductivity type, provided at a position in contact with the gate insulating film inside the drain layer, having a shallower bottom face than each of the first deep holes, and a source region of a first conductivity type provided at inner surface of the base region to be contact with the gate insulating film, the source region not being in contact with the drain layer due to the base region, wherein when a voltage is applied to the gate electrode plugs to invert a conductivity type of a portion of the base region in contact with the gate insulating film into the first conductivity type so as to form an inversion layer, the source region and the drain layer positioned below a bottom face of the base region are connected to each other through the inversion layer, and filling regions of the second conductivity type are provided in the second deep holes.

The present invention also provides the transistor wherein an insulating film is provided on the processed substrate, second shallow holes having a same planar shape as that of the second deep holes are provided above the second deep holes in the insulating film, and the filling regions are provided in the second deep holes and the second shallow holes.

The present invention further provides the transistor wherein buried regions made of a semiconductor of the second conductivity type are provided in the first deep holes at positions below the gate electrode plugs while being insulated from the gate electrode plugs.

The present invention is the transistor wherein a length of the filling regions in a depth direction is larger than a length of the buried regions in a depth direction.

The present invention provides the transistor, wherein the semiconductor of the second conductivity type constituting the filling regions and the buried regions are formed at a same fabrication step.

The present invention further provides the transistor, wherein a relay diffusion region formed by a diffusion region of the second conductivity type, being shallower than each of the filling regions, is provided between the filling regions.

The present invention is a transistor, wherein the second deep holes are formed by etching at the same etching step as the first deep holes.

The present invention is a diode comprising a processed substrate including a low concentration layer of a first conductivity type formed on one face thereof, the processed substrate having a plurality of first deep holes provided on its low concentration layer side and a plurality of ring-shaped second deep holes provided so as to concentrically surround the plurality of first deep holes, first filling regions of a second conductivity type provided in the first deep holes, and a Schottky electrode provided in contact with the low concentration layer and the first filling regions, the Schottky electrode forming a Schottky junction with the low concentration layer while forming an ohmic junction with each of the first filling regions, wherein the second filling regions of the second conductivity type are provided in the second deep holes, and the Schottky electrode is not in contact with the second filling regions.

The present invention further provides the diode comprising an insulating film including shallow holes above the second deep holes, wherein the second filling regions are provided in the second deep holes and the shallow holes.

The present invention is the diode, wherein a relay diffusion region consisting of a diffusion region of the second conductivity type, being shallower than the first and second filling regions, and the relay diffusion layer is provided between the second filling regions.

The present invention is a method of manufacturing a transistor including a processed substrate including a drain layer of a first conductivity type provided on one face thereof, the processed substrate having a plurality of first deep holes provided on drain layer side and a plurality of ring-shaped second deep holes provided so as to concentrically surround the plurality of first deep holes; a gate insulating film provided on at least a part of a side face of each of the first deep holes; gate electrode plugs provided in the first deep holes and being in contact with the gate insulating film; a base region of a second conductivity type, provided at a position in contact with the gate insulating film inside the drain layer, having a shallower bottom face than each of the first deep holes; and a source region of a first conductivity type provided at inner surface of the base region to be contact with the gate insulating film, the source region not being in contact with the drain layer due to the base region, wherein, when a voltage is applied to the gate electrode plugs to invert a conductivity type of a portion of the base region in contact with the gate insulating film into the first conductivity type so as to form an inversion layer, the source region and the drain layer being positioned below a bottom face of the base region are connected to each other through the inversion layer, the method comprising the steps of partially diffusing an impurity of the second conductivity type from a surface of the drain layer of the first conductivity type so as to form the base region, forming an insulating film above the base region including a circumference portion of the base region, patterning the insulating film to provide first shallow holes above the base region and second shallow holes at a circumferential position of the base region, etching the base region and the drain layer on bottom faces of the first and second shallow holes using the patterned insulating film as a mask so as to form the first and second deep holes being deeper than the base region, growing fillers made of a semiconductor of the second conductivity type in the first and second deep holes and the first and second shallow holes, removing the fillers in upper parts of the first deep holes and in the first shallow holes so that remaining parts of the fillers respectively form buried regions, each having an upper portion being positioned below the base region, and forming a gate insulating film on a side face of each of the first deep holes, the side face being positioned above the buried region.

The present invention is the method of manufacturing a transistor further comprising, forming relay diffusion layer having same depth as base region to be contact with the filling region by diffusing an impurity of second conductivity type at a region where the second deep holes will be formed, when the impurity consisting of base region is diffused.

DETAILED DESCRIPTION OF THE PREFERRED EMBODIMENTS

Hereinafter, embodiments of the present invention will be described with reference to the accompanying drawings.

Figure 1:
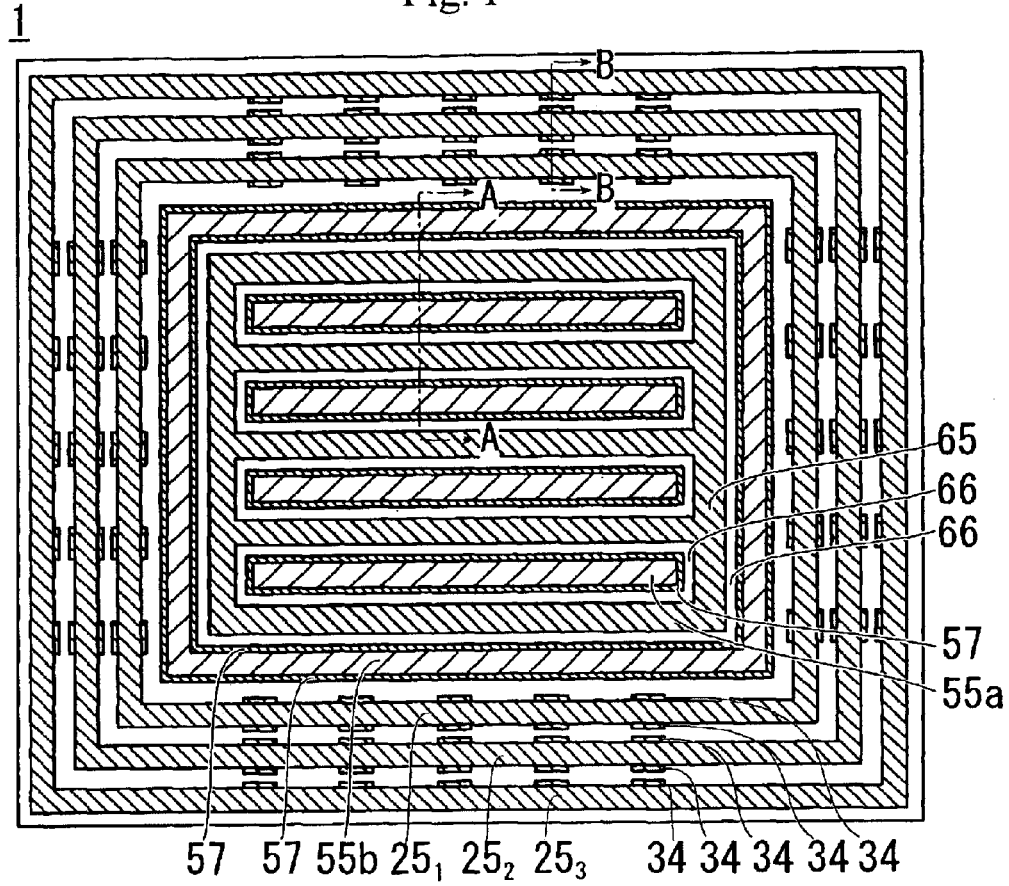
FIG. 1 is a sectional view of a transistor according to one embodiment of the present invention, showing a processed substrate taken along a plane across a source region and parallel to its surface.
Figures 2A, 2B:
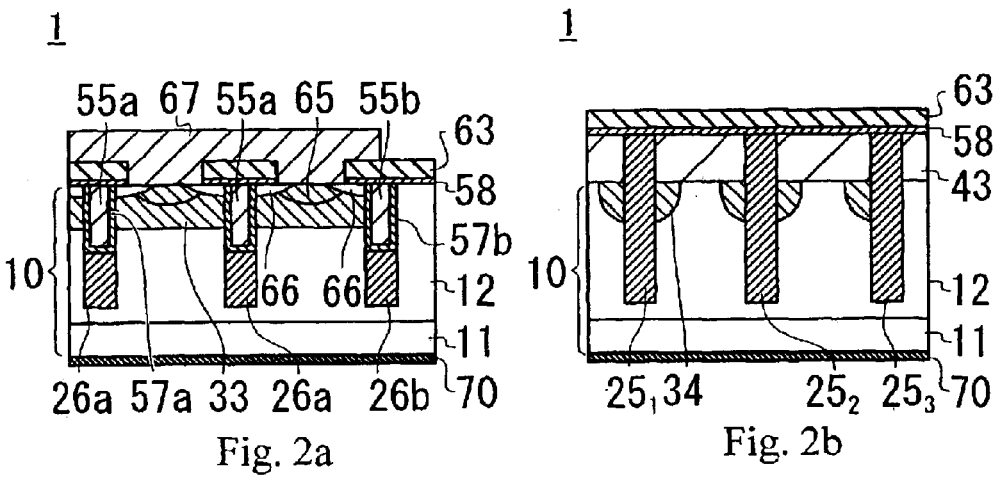
FIG. 2(a) is a sectional view taken along the line A—A in FIG. 1.
FIG. 2(b) is a sectional view taken along the line B—B is FIG. 1.

FIG. 1 is a sectional view of a transistor according to one embodiment of the present invention. This sectional view shows a processed substrate taken along a plane which is across a source region described below and is parallel to a surface of the substrate. FIG. 2(a) is a sectional view taken along a line A—A in FIG. 1, and FIG. 2(b) is a sectional view taken along a line B—B in FIG. 1. The reference numeral 1 in FIGS. 1, 2(a), and 2(b) denotes a transistor according to one embodiment of the present invention.

First, a manufacturing process of the transistor 1 according to one embodiment of the present invention will be described.

FIGS. 3(a) to 25(a) are sectional views, each illustrating a manufacturing step of a portion corresponding to a cross section taken along the line A—A in FIG. 1, whereas FIGS. 3(b) to 25(b) are sectional views, each illustrating a manufacturing step of a portion corresponding to a cross section taken along the line B—B in FIG. 1.

Figure 3A:
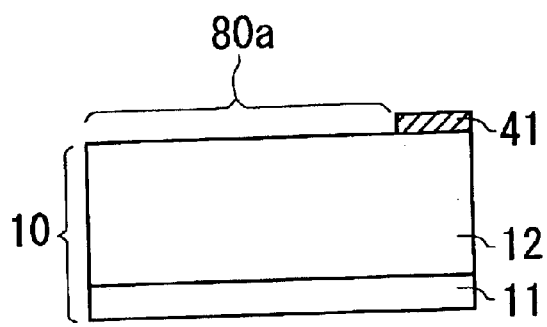
FIG. 3(a) is a first sectional view for illustrating a manufacturing step of a portion corresponding to a cross section taken along the line A—A in FIG. 1.
Figure 3B:
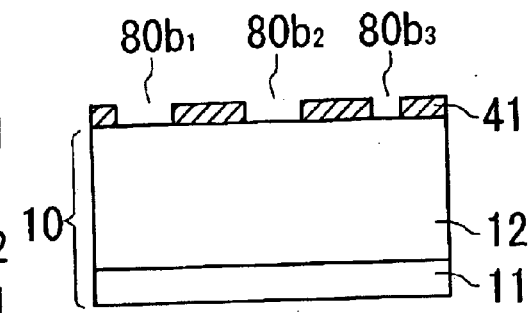
FIG. 3(b) is a first sectional view for illustrating the manufacturing step of a portion corresponding to a cross section taken along the line B—B in FIG. 1.

First, referring to FIGS. 3(a) and 3(b), the reference numeral 10 denotes a processed substrate on which a plurality of patterns of the transistor 1 are to be formed by employing the manufacturing process described below. The processed substrate 10 includes a single crystalline substrate 11 made of silicon single crystal and a drain layer 12. The drain layer 12 is formed of silicon epitaxially grown on the surface of the single-crystalline substrate 11. The processed substrate 10 is an example of a semiconductor substrate used in the present invention. In this embodiment, n-type is described as a first conductivity type and p-type is described as a second conductivity type. The single crystalline substrate 11 and the drain layer 12, each having a first conductivity type, are used in this embodiment.

On the surface of the drain layer 12, a silicon oxide film 41 having a plurality of openings 80a and $80b_1$ to $80b_3$ is formed.

Among these openings 80a and $80b_1$ to $80b_3$, the opening 80a is a large opening having a rectangular planar shape, situated at the center of the processed substrate 10. The openings $80b_1$ to $80b_3$ are a plurality of small openings placed at predetermined positions outside the large opening 80a. On the bottom of each of the openings 80a and $80b_1$ to $80b_3$, the drain layer 12 is exposed.

Figure 4A:
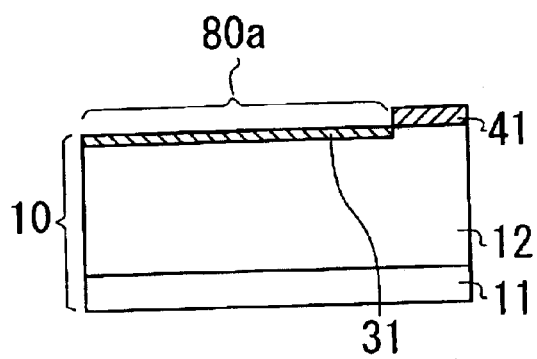
FIG. 4(a) is a second sectional view for illustrating a manufacturing step of a portion corresponding to a cross section taken along the line A—A in FIG. 1.
Figure 4B:
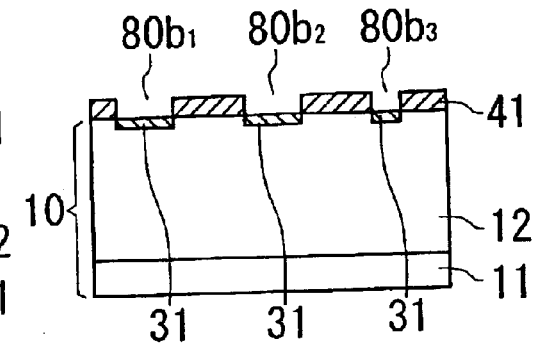
FIG. 4(b) is a second sectional view for illustrating the manufacturing step of a portion corresponding to a cross section taken along the line B—B in FIG. 1.
Figure 5A:
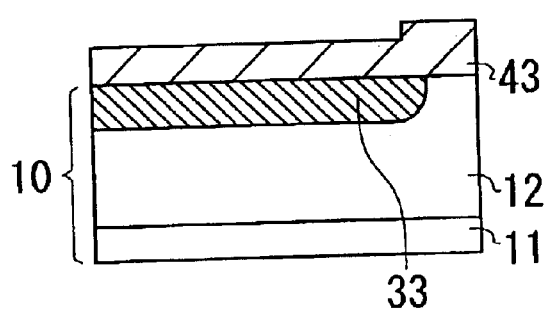
FIG. 5(a) is a third sectional view for illustrating a manufacturing step of a portion corresponding to a cross section taken along the line A—A in FIG. 1.
Figure 5B:
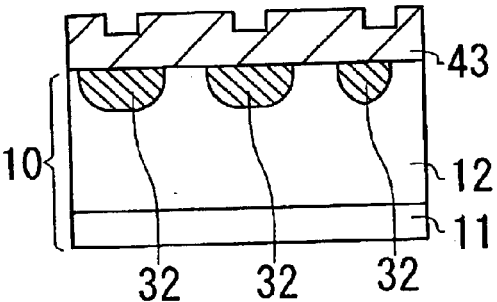
FIG. 5(b) is a third sectional view for illustrating the manufacturing step of a portion corresponding to a cross section taken along the line B—B in FIG. 1.

When the surface of the processed substrate 10 as described above is irradiated with an impurity of a second conductivity type such as boron, the impurity of the second conductivity type is injected into the inner surface of the drain layer 12 exposed on the bottom of each of the openings 80a and $80b_1$ to $80b_3$ with the silicon oxide film 41 serving as a mask. As a result, as shown in FIGS. 4(a) and 4(b), injection layers 31 of the second conductivity type having the same plane shapes as those of the openings 80a and $80b_1$ to $80b_3$ are formed on the inner surface of the drain layer 12.

Next, when a thermal oxidation treatment is performed, the impurity in the injection layer 31 of the second conductivity type is diffused to form diffusion regions of the second conductivity type. Among the diffusion regions of the second conductivity type, the reference numeral 33 in FIGS. 5(a) and 5(b) denotes a base region formed below the bottom face of the large opening 80a. The reference numeral 32 denotes interspersed regions of the second conductivity type, which are formed below the bottom faces of the small openings $80b_1$ to $80b_3$ so as to be interspersed on the inner surface of the drain layer 12.

The bottom faces of the base region 33 and the interspersed regions 32 do not reach the single crystalline substrate 11, but are situated inside the drain layer 12. Therefore, the base region 33 and the interspersed regions 32 form PN junctions with the drain layer 12.

On the other hand, the surfaces of the base region 33 and the interspersed regions 32 are exposed on the surface of the processed substrate 10. By a thermal oxidation treatment treated at the time of formation of the base region 33 and the interspersed regions 32, an insulating film 43 formed of a silicon oxide film is formed on the entire surface of the processed substrate 10 including the surface of the base region 33 and the surfaces of the interspersed regions 32.

Besides the thermal oxidation, this insulating film 43 may also be formed by CVD. Moreover, besides the silicon oxide film, the insulating film 43 may also be formed of a silicon nitride film.

Figure 6A:
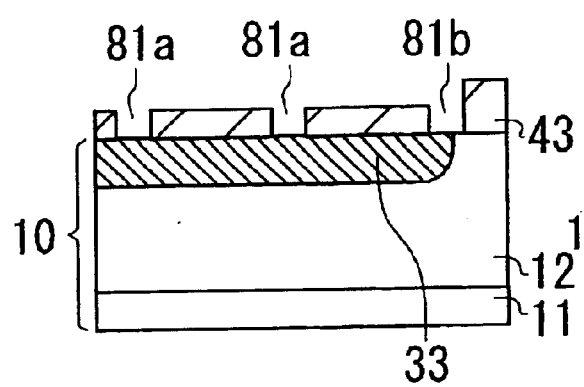
FIG. 6(a) is a 4th sectional view for illustrating a manufacturing step of a portion corresponding to a cross section taken along the line A—A in FIG. 1.
Figure 6B:
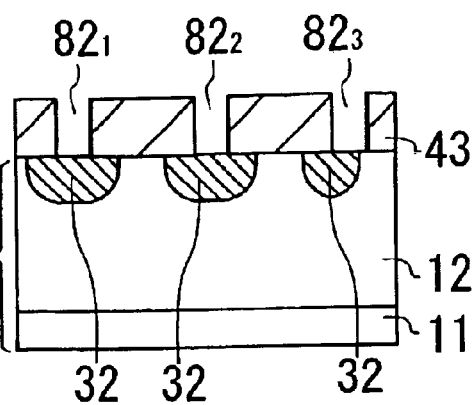
FIG. 6(b) is a 4th sectional view for illustrating the manufacturing step of a portion corresponding to a cross section taken along the line B—B in FIG. 1.
Figure 26:
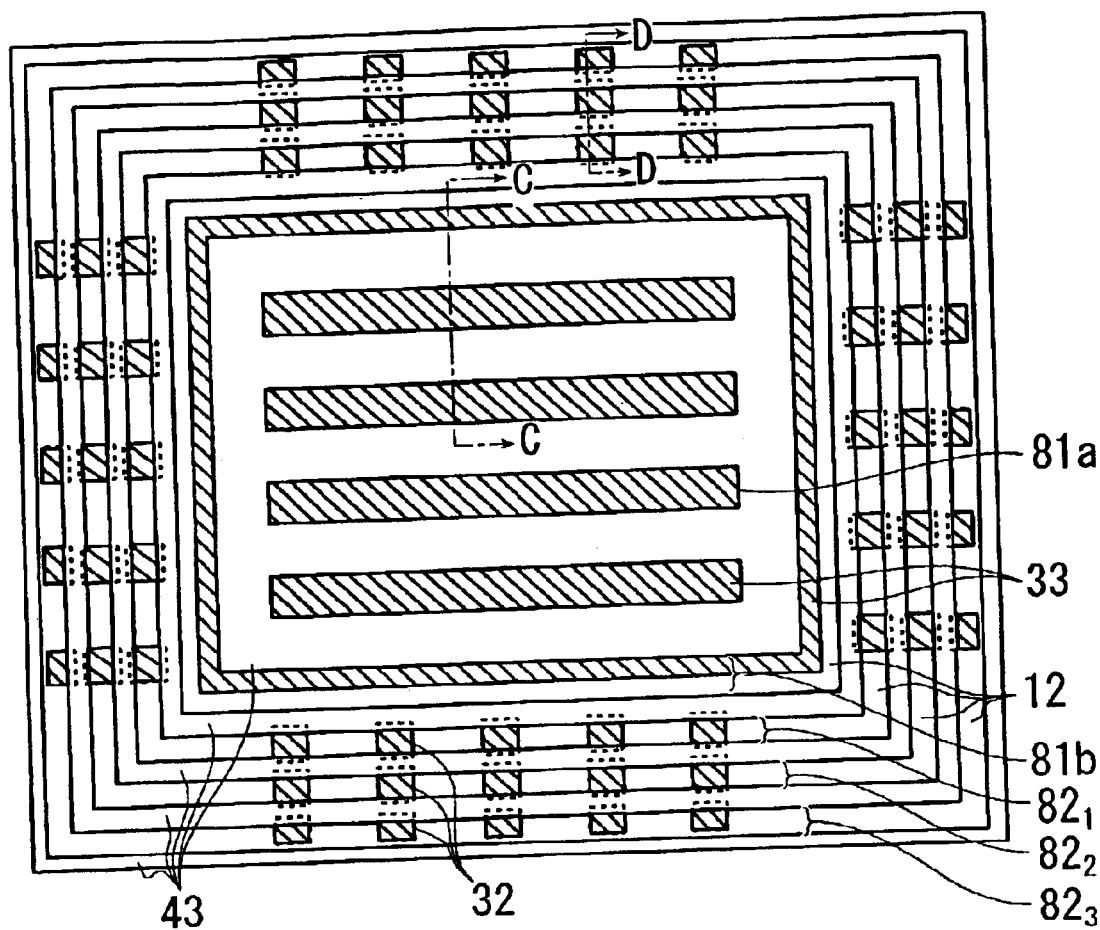
FIG. 26 is a first plan view showing a manufacturing step according to an embodiment of the present invention.

Next, the insulating film 43 is patterned. FIG. 26 is a plan view for illustrating a planar shape of the insulating film 43 being patterned. FIGS. 6(a) and 6(b) are sectional views taken along a line C—C and a line D—D in FIG. 26, respectively.

Among shallow holes formed by patterning the insulating film 43, the reference numeral 81a in FIGS. 6(a), 6(b), and FIG. 26 denotes a plurality of first shallow holes formed on a portion where the base region 33 is positioned.

These first shallow holes 81a, each having an oblong shape, are parallel to each other and provided at equal intervals so as to be positioned inside the edge of the base region 33. A length of each of the first shallow holes 81a is shorter than that of the base region 33. Therefore, the surface of the base region 33 is exposed on the bottom faces of the first shallow holes 81a.

Moreover, the reference numeral 81b in FIGS. 6(a), 6(b), and FIG. 26 denotes a rectangular ring-shaped shallow hole 81b positioned on the edge of the base region 33. The edge portion of the base region 33 is positioned below the bottom face of the ring-shaped shallow hole 81b. Thus, a portion of the PN junction formed by the interface between the base region 33 and the drain layer 12, which is positioned on the surface of the processed substrate 10, is situated on the bottom face of the ring-shaped shallow hole 81b.

In other words, the surface of the base region 33 is exposed through the ring-shaped shallow hole 81b on its inner circumferential side, whereas the surface of the drain layer 12 is exposed through the ring-shape shallow hole 81b on its outer circumferential side.

The reference numerals $82_1$ to $82_3$ in FIGS. 6(a), 6(b), and FIG. 26 denote a plurality of quadrangular ring-shaped second shallow holes which are concentrically provided so as to surround the first shallow holes 81a and the ring-shaped shallow hole 81b.

The second shallow holes $82_1$ to $82_3$ have the same width and are placed at equal intervals. The interspersed regions 32 are situated below the bottom faces of the second shallow holes $82_1$ to $82_3$; at least one interspersed region 32 is situated below the bottom face of one of the second shallow holes $82_1$ to $82_3$.

The interspersed regions 32 have such size that these interspaced regions 32 both outward and inward or inward protrude beyond the second shallow holes $82_1$ to $82_3$.

Figure 7A:
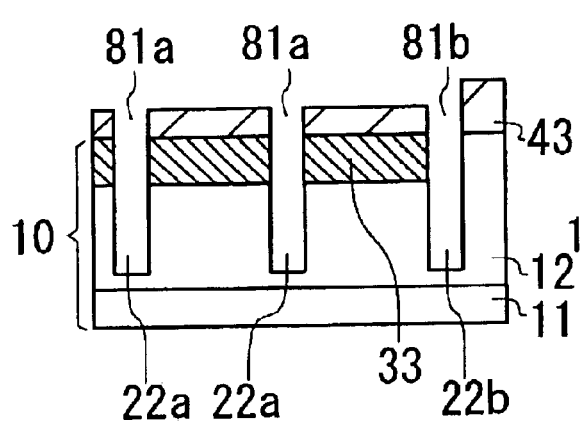
FIG. 7(a) is a 5th sectional view for illustrating a manufacturing step of a portion corresponding to a cross section taken along the line A—A in FIG. 1.
Figure 7B:
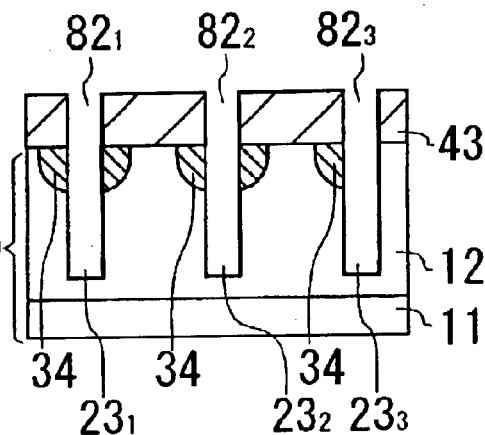
FIG. 7(b) is a 5th sectional view for illustrating the manufacturing step of a portion corresponding to a cross section taken along the line B—B in FIG. 1.

Next, a part of the processed substrate 10, which is exposed on the bottom faces of the first shallow holes 81a, the ring-shaped shallow hole 81b and the second shallow holes $82_1$ to $82_3$, is etched for a predetermined period of time, using the insulating film 43 as a mask. Then, as shown in FIGS. 7(a) and 7(b), first deep holes 22a, a ring-shaped deep hole 22b, and second deep holes $23_1$ to $23_3$ are respectively formed below the bottom faces of the first shallow holes 81a, the ring-shaped shallow hole 81b, and the second shallow holes $82_1$ to $82_3$.

Planar shapes of the first deep holes 22a, the ring-shaped deep hole 22b, and the second deep holes $23_1$ to $23_3$ are the same as those of the first shallow holes 81a, the ring-shaped shallow hole 81b, and the second shallow holes $82_1$ to $82_3$ that form the above-described deep holes 22a, 22b, and $23_1$ to $23_3$.

Since width of the first shallow holes 81a, width of the ring-shaped shallow hole 81b are same as the second shallow holes $82_1$ to $82_3$, the deep holes 22a, 22b, and $22_1$ to $22_3$ also have an equal width.

Since the deep holes 22a, 22b, and $23_1$ to $23_3$ are simultaneously formed at the same etching step, their depths are almost equal to each other. By adjusting the amount of etching time, the bottom face of each of the deep holes 22a, 22b, and $23_1$ to $23_3$ is formed deeper than a diffusion depth of the base region 33 or the interspersed regions 32 so as to be present inside the drain layer 12.

The outer circumferential region of the base region 33 is scraped away by the ring-shaped deep hole 22b. As a result, the base region 33 has a constant depth. Therefore, as the PN junction between the base region 33 and the drain layer 12, only a planar junction remains.

The second deep holes $23_1$ to $23_3$ scrape away the central portions or the outer circumferential portions of the interspersed regions 32. The remaining portion is denoted by the reference numeral 34 as a relay diffusion region. Then, for the second deep hole $23_3$ which is situated at the outermost circumference of the second deep holes $23_1$ to $23_3$, the relay diffusion region 34 is formed at the position being in contact with the inner circumference of the second deep hole $23_3$. For each of the other second deep holes $23_1$ and $23_2$, the relay diffusion regions 34 are formed both at the position being in contact with its inner circumference and at the position being in contact with its outer circumference.

In short, in this embodiment, the relay diffusion regions 34 are formed both on the inner circumference and on the outer circumference for each of the second deep holes $23_1$ and $23_2$ other than the deep hole situated at the outermost circumference, whereas the relay diffusion region 34 is formed only at the position being in contact with the inner circumference for the second hole $23_3$ situated at the outermost circumference.

The relay diffusion regions 34 traversing the second deep holes $23_1$ to $23_3$ have widths that are equal to each other. Moreover, the relay diffusion regions 34 situated between the second deep holes $23_1$ to $23_3$ are in contact with any one of the adjacent second deep holes $23_1$ to $23_3$, and therefore, do not get in contact with both of the adjacent second deep holes $23_1$ to $23_3$.

Figure 8A:
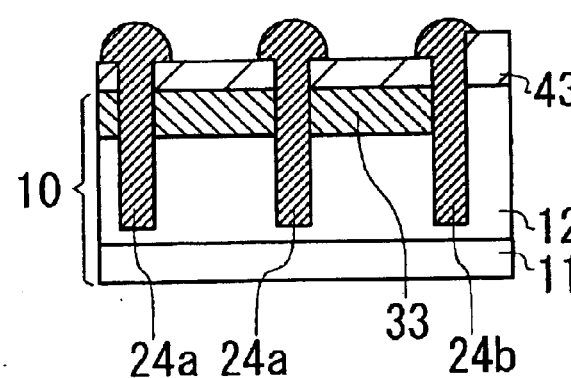
FIG. 8(a) is a 6th sectional view for illustrating a manufacturing step of a portion corresponding to a cross section taken along the line A—A in FIG. 1.
Figure 8B:
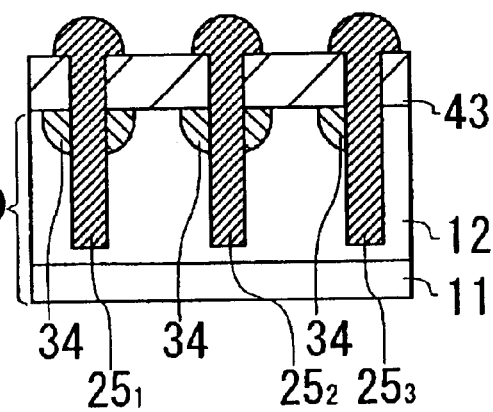
FIG. 8(b) is a 6th sectional view for illustrating the manufacturing step of a portion corresponding to a cross section taken along the line B—B in FIG. 1.

Next, the processed substrate 10 as described above is conveyed into a CVD apparatus where the processed substrate 10 is heated at a high temperature with the introduction of a material gas of silicon and an additive gas containing an impurity of the second conductivity type. Then, as shown in FIGS. 8(a) and 8(b), fillers 24a, 24b, and $25_1$ to $25_3$, each being made of silicon single crystal to which the impurity of the second conductivity type is added, begins to epitaxially grow on the bottom faces and the inner side faces of each of the deep holes 22a, 22b, and $23_1$ to $23_3$.

When the inside of each of the deep holes 22a, 22b, and $23_1$ to $23_3$ is completely filled with each of the fillers 24a, 24b, and $25_1$ to $25_3$ so that its upper edge upward protrudes beyond the surface of the insulating film 43, the epitaxial growth is terminated.

Herein, the bottom face and the side face of each of the fillers 24a, 24b, and $25_1$ to $25_3$ are respectively in contact with the bottom face and the inner side faces of each of the deep holes 22a, 22b, and $23_1$ to $23_3$.

Figure 9A:
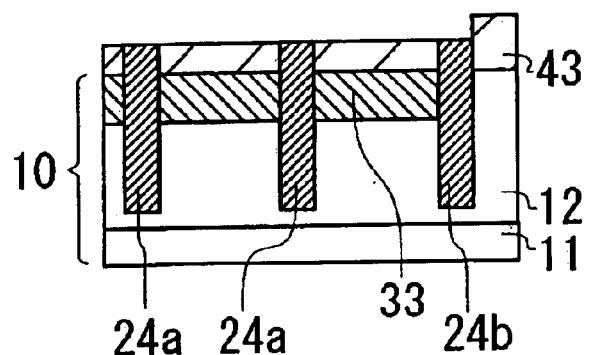
FIG. 9(a) is a 7th sectional view for illustrating a manufacturing step of a portion corresponding to a cross section taken along the line A—A in FIG. 1.
Figure 9B:
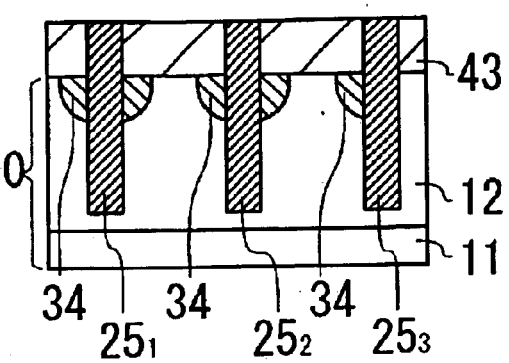
FIG. 9(b) is a 7th sectional view for illustrating the manufacturing step of a portion corresponding to a cross section taken along the line B—B in FIG. 1.
Figure 10A:
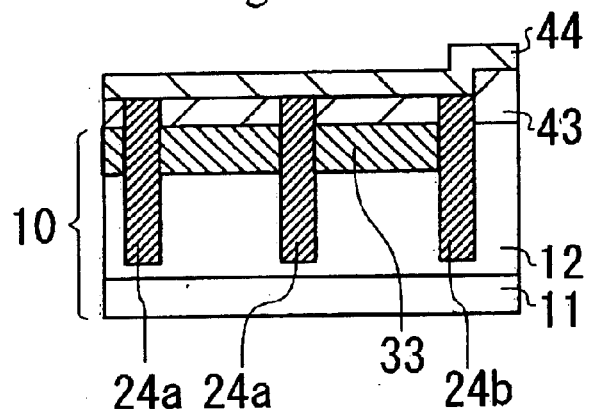
FIG. 10(a) is a 8th sectional view for illustrating a manufacturing step of a portion corresponding to a cross section taken along the line A—A in FIG. 1.
Figure 10B:
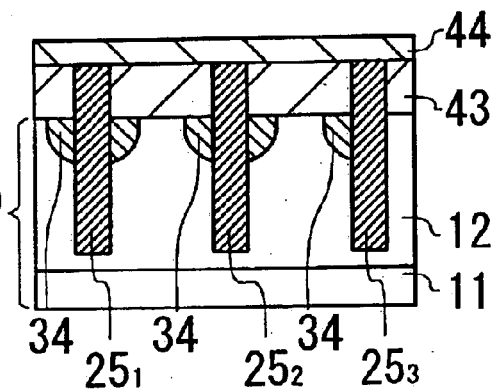
FIG. 10(b) is a 8th sectional view for illustrating the manufacturing step of a portion corresponding to a cross section taken along the line B—B in FIG. 1.

Next, as shown in FIGS. 9(a) and 9(b), the fillers 24a, 24b, and $25_1$ to $25_3$ are etched so as to remove the parts situated above the surface of the insulating film 43. Thereafter, as shown in FIGS. 10(a) and 10(b), a mask oxide film 44 made of a silicon oxide film is formed on the surfaces of the insulating film 43 and the fillers 24a, 24b, and $25_1$ to $25_3$. The mask oxide film 44 can be formed by CVD or thermal oxidation.

Figure 11A:
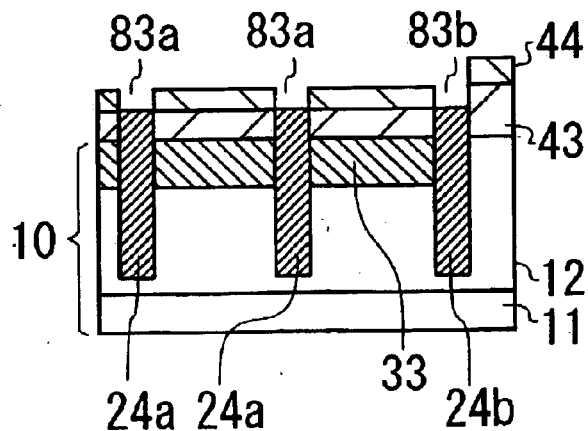
FIG. 11(a) is a 9th sectional view for illustrating a manufacturing step of a portion corresponding to a cross section taken along the line A—A in FIG. 1.
Figure 11B:
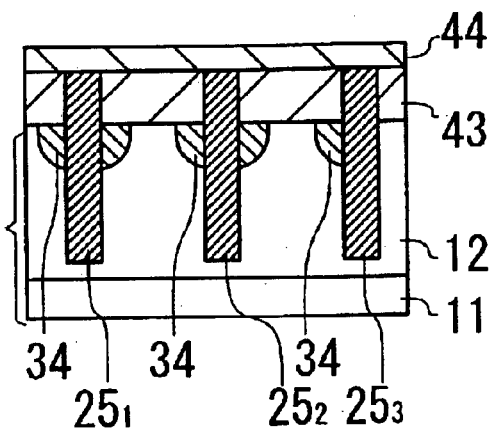
FIG. 11(b) is a 9th sectional view for illustrating the manufacturing step of a portion corresponding to a cross section taken along the line B—B in FIG. 1.

Next, as shown in FIGS. 11(a) and 11(b), the mask oxide film 44 is patterned so as to expose the surfaces of the fillers 24a situated within the first shallow holes 81a and the first deep holes 22a and the surface of the filler 24b situated in the ring-shaped shallow hole 81b and the ring-shaped deep hole 22b. The reference numerals 83a and 83b denote openings for exposing the fillers 24a and 24b, respectively. The mask oxide film 44 on the surface between the first shallow holes 81a may also be removed so as to expose the insulating film 43.

At this moment, the mask oxide film 44 is placed on the fillers $25_1$ to $25_3$ filling the second shallow holes $82_1$ to $82_3$ and the second deep holes 23₁ to 23₃. Thus, the upper parts of the fillers 25₁ to 25₃ are not exposed.

Figure 12A:
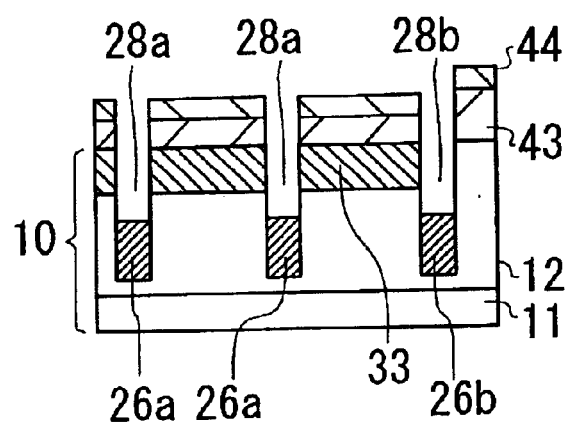
FIG. 12(a) is a 10th sectional view for illustrating a manufacturing step of a portion corresponding to a cross section taken along the line A—A in FIG. 1.
Figure 12B:
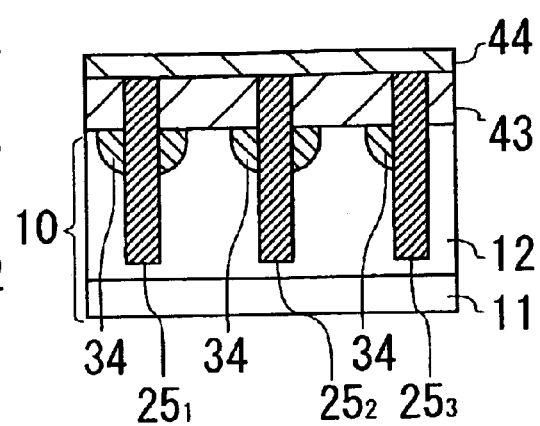
FIG. 12(b) is a 10th sectional view for illustrating the manufacturing step of a portion corresponding to a cross section taken along the line B—B in FIG. 1.

When the fillers 24a and 24b are etched in this state, as shown in FIGS. 12(a) and 12(b), portions of the fillers 24a and 24b situated within the first shallow holes 81a and the ring-shaped shallow hole 81b and the upper portions of the fillers 24a and 24b within the first deep holes 22a and the ring-shaped deep hole 22b situated below the above-mentioned portions are removed so that the remaining portions of the fillers 24a and 24b form buried regions 26a and 26b on the bottom faces inside the first deep holes 22a and the ring-shaped deep hole 22b, respectively. The upper ends of these buried regions 26a and 26b are formed so as to have a depth deeper than the depth of the base region 33.

On the other hand, the fillers 25₁ to 25₃ situated in the second shallow holes 82₁ to 82₃ and in the second deep holes 23₁ to 23₃ are left unetched. As a result, the fillers 25₁ to 25₃ form filling regions. These filling regions are denoted by the same reference numerals 25₁ to 25₃ as those of the fillers. The second shallow holes 82₁ to 82₃ and the second deep holes 23₁ to 23₃ and the filling regions 25₁ to 25₃ form guard rings.

When the upper portions of the fillers 24a and 24b are etched to form the buried regions 26a and 26b, the etched portions are left as holes. Therefore, assuming that the thus formed holes are referred to as gate holes 28a and 28b, the gate holes 28a and 28b are situated at the upper parts of the first deep hole 22a and the ring-shaped deep hole 22b, respectively. The bottom faces of the gate holes 28a and 28b are constituted by the upper ends of the buried regions 26a and 26b, respectively.

If the etching is uniformly proceeded, the gate holes 28a and 28b have the same depth.

Figure 13A:
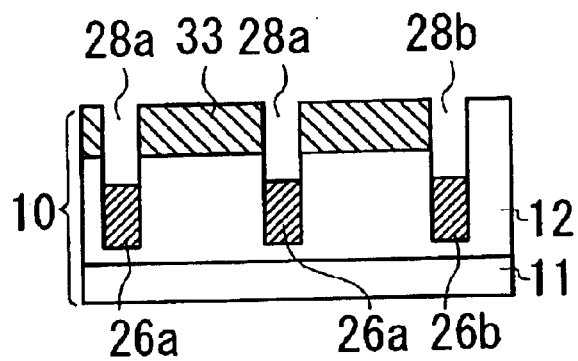
FIG. 13(a) is a 11th sectional view for illustrating a manufacturing step of a portion corresponding to a cross section taken along the line A—A in FIG. 1.
Figure 13B:
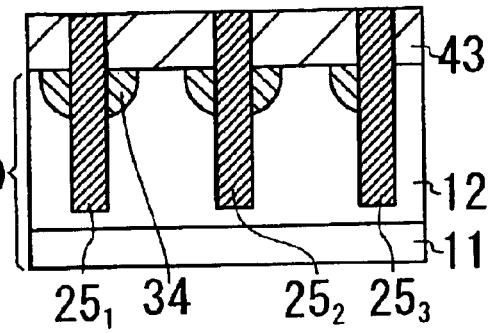
FIG. 13(b) is a 11th sectional view for illustrating the manufacturing step of a portion corresponding to a cross section taken along the line B—B in FIG. 1.

Next, after the mask oxide film 44 is etched away so as to expose the surfaces of the filling regions 25₁ to 25₃, the filling regions 25₁ to 25₃ and their peripheries are covered with a resist not shown. The insulating film 43 on, the base region 33 is etched away using the resist as a mask to expose the surface of the base region 33 as shown in FIGS. 13(a) and 13(b).

Figure 14A:
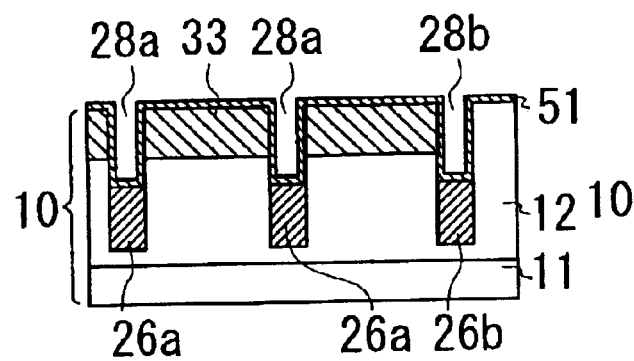
FIG. 14(a) is a 12th sectional view for illustrating a manufacturing step of a portion corresponding to a cross section taken along the line A—A in FIG. 1.
Figure 14B:
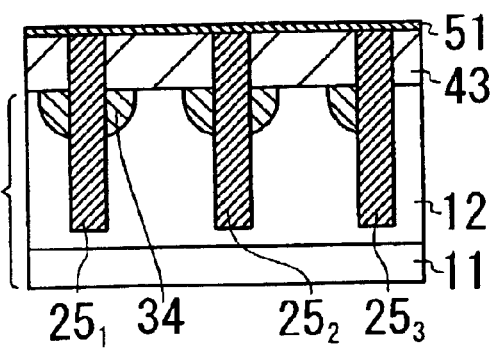
FIG. 14(b) is a 12th sectional view for illustrating the manufacturing step of a portion corresponding to a cross section taken along the line B—B in FIG. 1.

After the resist is removed, a thermal oxidation treatment is treated. As a result, as shown in FIGS. 14(a) and 14(b), a thermal oxidation film 51 is formed on the inner side faces and the bottom faces of the respective gate holes 28a and 28b, the surface of the processed substrate 10 and the surface of the insulating film 43.

Figure 15A:
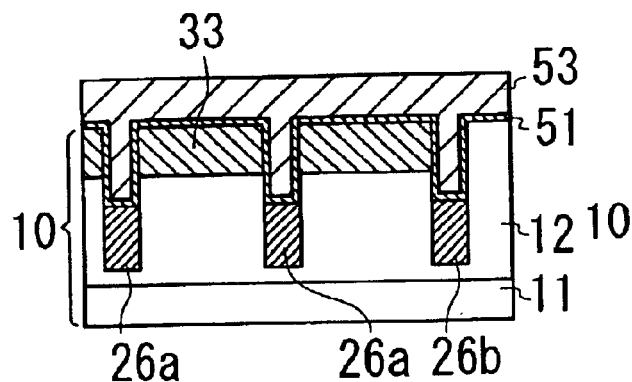
FIG. 15(a) is a 13th sectional view for illustrating a manufacturing step of a portion corresponding to a cross section taken along the line A—A in FIG. 1.
Figure 15B:
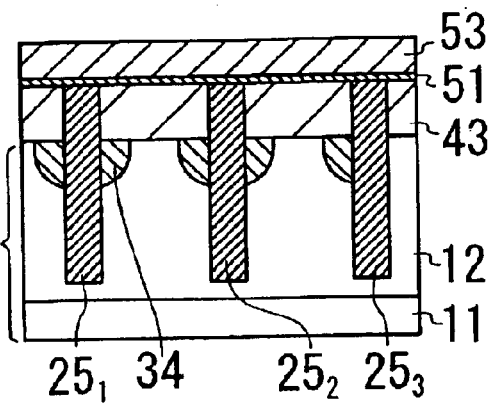
FIG. 15(b) is a 13th sectional view for illustrating the manufacturing step of a portion corresponding to a cross section taken along the line B—B in FIG. 1.

Subsequently, polysilicon is deposited on the surface of the thermal oxide film 51 on the side of the processed substrate 10 where the openings of the respective gate holes 28a and 28b are situated. As a result, as shown in FIGS. 15(a) and 15(b), a polysilicon thin film 53 is formed on the thermal oxide film 51 on the surface of the processed substrate 10, while each of the gate holes 28a and 28b is filled with the polysilicon thin film 53.

Figure 16A:
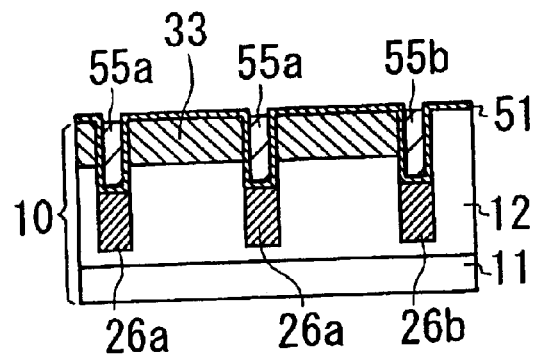
FIG. 16(a) is a 14th sectional view for illustrating a manufacturing step of a portion corresponding to a cross section taken along the line A—A in FIG. 1.
Figure 16B:
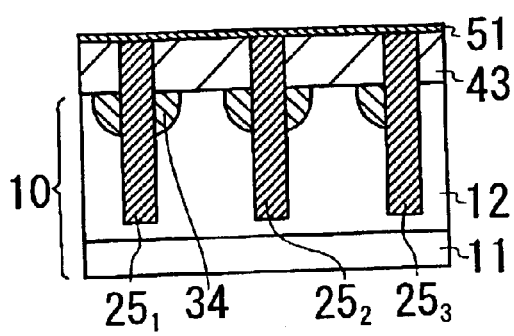
FIG. 16(b) is a 14th sectional view for illustrating the manufacturing step of a portion corresponding to a cross section taken along the line B—B in FIG. 1.

In such a state, the polysilicon thin film 53 is etched by a predetermined amount to remove a part of the polysilicon thin film 53 situated on the thermal oxide film 51 on the surface of the processed substrate 10 and the upper end portion of the polysilicon thin film 53 within each of the gate holes 28a and 28b. Then, the portions of the polysilicon thin film 53 in the gate holes 28a and 28b are separated from each other. As a result, each of the gate holes 28a and 28b is filled with the remaining portion of the polysilicon thin film 53 as shown in FIGS. 16(a) and 16(b). A rectangular gate electrode plug 55a made of the remaining portion of the polysilicon thin film 53, having a rectangular planar shape, is formed within each of the rectangular gate holes 28a. Along with the formation of the gate electrode plugs 55a, a ring-shaped electrode plug 55b made of the remaining portion of the polysilicon thin film 53 is formed in the ring-shaped gate hole 28b.

Figure 17A:
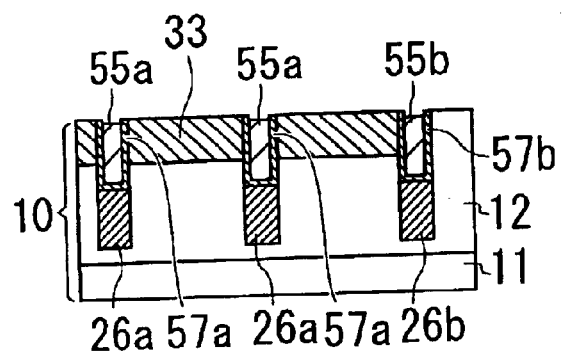
FIG. 17(a) is a 15th sectional view for illustrating a manufacturing step of a portion corresponding to a cross section taken along the line A—A in FIG. 1.
Figure 17B:
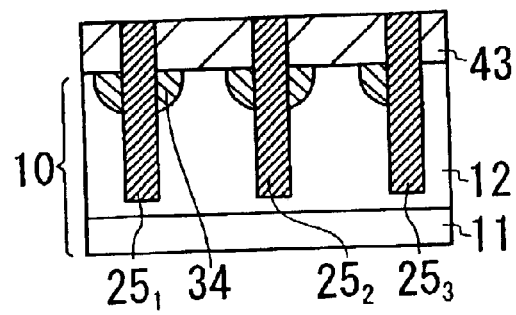
FIG. 17(b) is a 15th sectional view for illustrating the manufacturing step of a portion corresponding to a cross section taken along the line B—B in FIG. 1.

Subsequently, the thermal oxide film 51 on the surface of the base region 33 and on the surface of the thermal oxide film 43 is etched away to expose the upper end of the filler 25 and the surface of the insulating film 43 as shown in FIG. 17(b). Simultaneously, the surface of the base region 33 is exposed as shown in FIG. 17(a), thereby leaving the silicon oxide film 51 only in the rectangular gate holes 28a and the ring-shaped gate hole 28b surrounding the gate holes 28a. The remaining parts of the thermal oxide film 51 in the rectangular gate holes 28a and the ring-shaped gate hole 28b are denoted as gate insulating films 57a and 57b. The rectangular gate electrode plugs 55a and the ring-shaped gate electrode plug 55b are insulated from the buried regions 26a and 26b and also insulated from the base region 33 by the gate insulating films 57a and 57b.

Figure 18A:
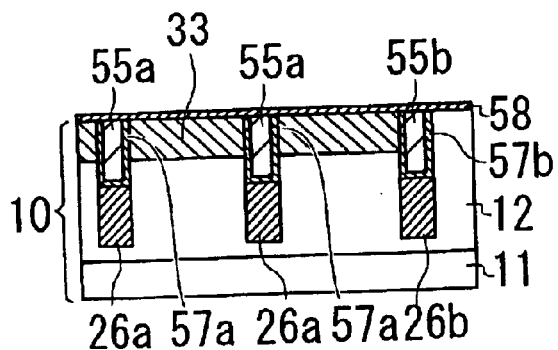
FIG. 18(a) is a 16th sectional view for illustrating a manufacturing step of a portion corresponding to a cross section taken along the line A—A in FIG. 1.
Figure 18B:
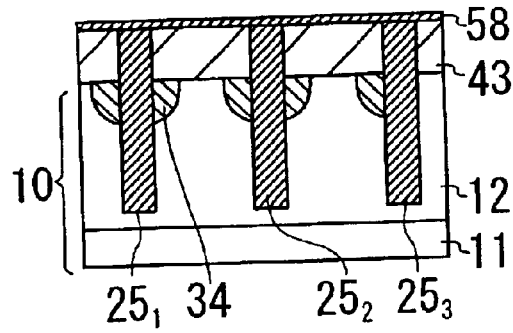
FIG. 18(b) is a 16th sectional view for illustrating the manufacturing step of a portion corresponding to a cross section taken along the line B—B in FIG. 1.

Next, the processed substrate 10 is subjected to a thermal oxide treatment to form an underlayer oxide film 58 formed of a silicon oxide film on the surfaces of the base region 33, the gate electrode plugs 55a and 55b, the thermal oxide film 43, and the fillers 25 as shown in FIGS. 18(a) and 18(b).

Figure 27:
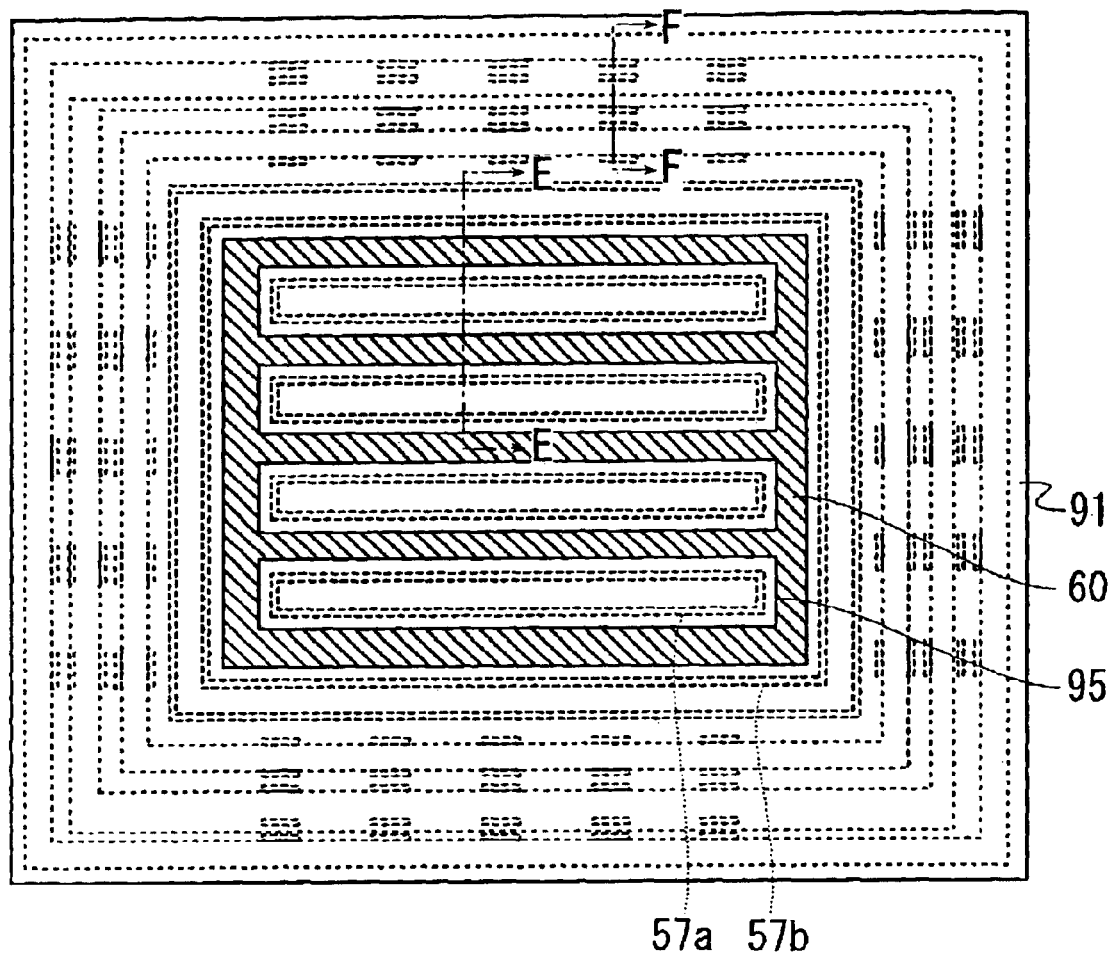
FIG. 27 is a second plan view showing a manufacturing step according to an embodiment of the present invention.

Subsequently, as shown in a plan view of FIG. 27, a resist film 91 having a quadrangular ring-shaped planar shape and a plurality of oblong resist films 95 in a rectangular shape positioned inside the resist film 91 are formed on the surface of the underlayer oxide film 58.

The ring-shaped gate electrode plug 55b is covered with the quadrangular ring-shaped resist film 91. Specifically, the edge of the inner circumference of the quadrangular ring-shaped resist film 91 is positioned inside the edge of the inner circumference of the ring-shaped gate electrode plug 55b by a predetermined distance.

Moreover, each of the rectangular gate electrode plugs 55a is covered with each of the oblong resist films 95.

Figure 19A:
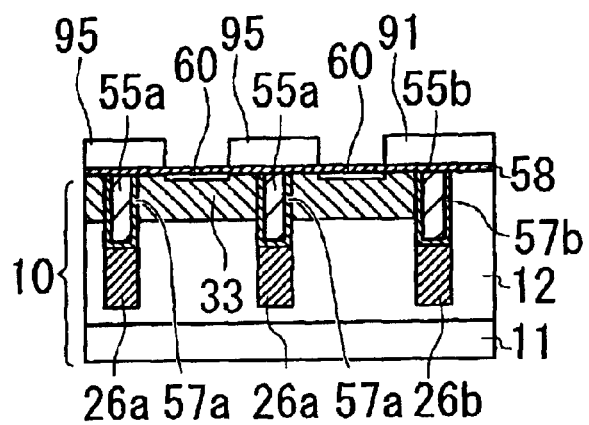
FIG. 19(a) is a 17th sectional view for illustrating a manufacturing step of a portion corresponding to a cross section taken along the line A—A in FIG. 1.
Figure 19B:
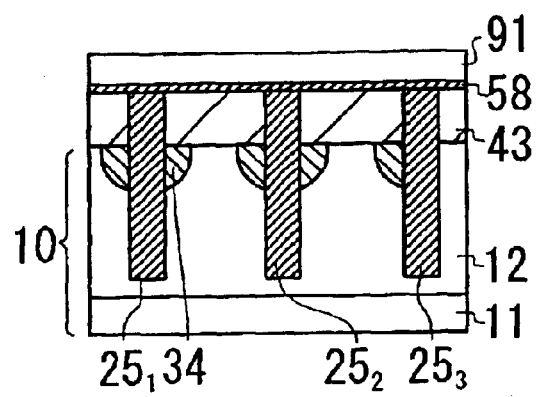
FIG. 19(b) is a 17th sectional view for illustrating the manufacturing step of a portion corresponding to a cross section taken along the line B—B in FIG. 1.

As an underlayer of the underlayer oxide film 58, which is exposed between the quadrangular ring-shaped resist film 91 and the oblong resist films 95, the base region 33 is positioned. When the underlayer oxide film 58 is irradiated with boron using the quadrangular ring-shaped resist film 91 and the oblong resist films 95 as masks, boron is injected below the underlayer oxide film 58 exposed between the resist films 91 and 95, that is, into the inner surface of the base region 33. As a result, high-concentration injected regions 60 of the second conductivity type are formed. This state is shown in FIGS. 19(a) and 19(b). FIGS. 19(a) and 19(b) correspond to a sectional view taken along the line E—E and a sectional view taken along the line F—F in FIG. 27, respectively.

Figure 20A:
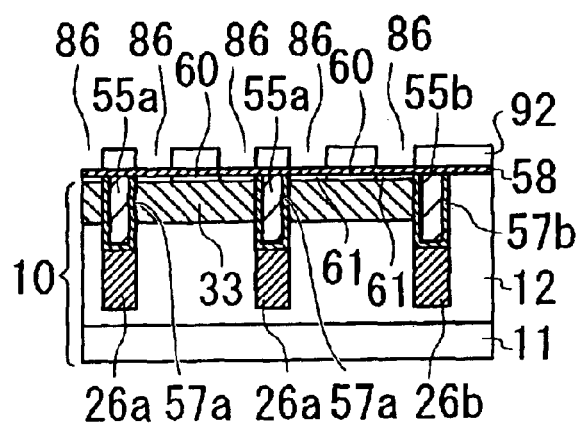
FIG. 20(a) is a 18th sectional view for illustrating a manufacturing step of a portion corresponding to a cross section taken along the line A—A in FIG. 1.
Figure 20B:
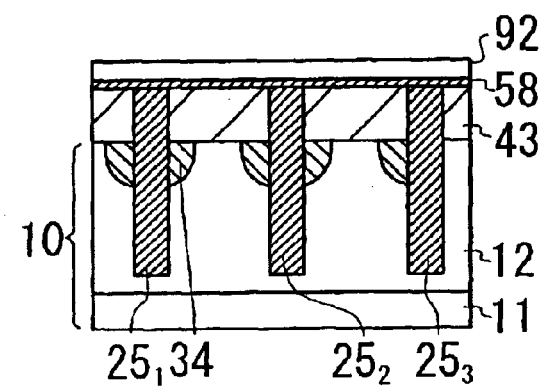
FIG. 20(b) is a 18th sectional view for illustrating the manufacturing step of a portion corresponding to a cross section taken along the line B—B in FIG. 1.

Next, the resist films 91 and 95 are removed so as to form a patterned resist film 92 on the surface of the underlayer oxide film 58. The resist film 92 has openings 86. On the bottom face of each of the openings 86, the underlayer oxide film 58 is exposed. Below the exposed underlayer oxide film 58, the base region 33 between the gate insulating films 57a and 57b and the high-concentration injected regions 60 of the second conductivity type is situated. When the surface of the processed substrate 10 is irradiated with arsenic using the resist film 92 as a mask, injected regions 61 of the first conductivity type having the same planar shape as that of the openings 86 are formed inner surface of the base region 33 positioned on the bottom faces of the openings 86. This state is shown in FIGS. 20(a) and 20(b).

Figure 21A:
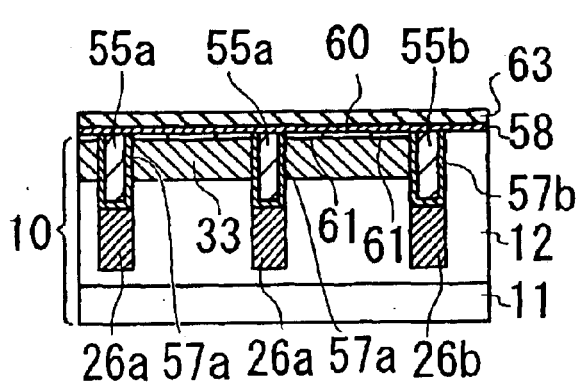
FIG. 21(a) is a 19th sectional view for illustrating a manufacturing step of a portion corresponding to a cross section taken along the line A—A in FIG. 1.
Figure 21B:
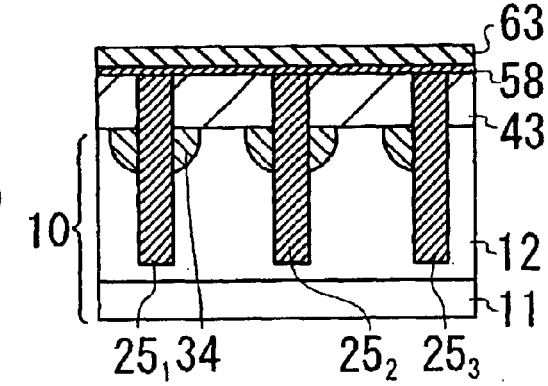
FIG. 21(b) is a 19th sectional view for illustrating the manufacturing step of a portion corresponding to a cross section taken along the line B—B in FIG. 1.

Next, the resist film 92 is removed. Then, a PSG film 63 is formed on the surface of the underlayer oxide film 58 as shown in FIGS. 21(a) and 21(b).

Figure 22A:
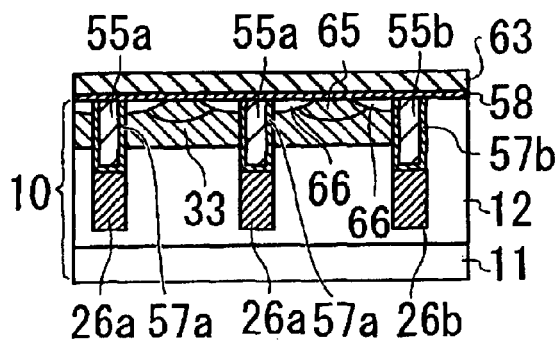
FIG. 22(a) is a 20th sectional view for illustrating a manufacturing step of a portion corresponding to a cross section taken along the line A—A in FIG. 1.
Figure 22B:
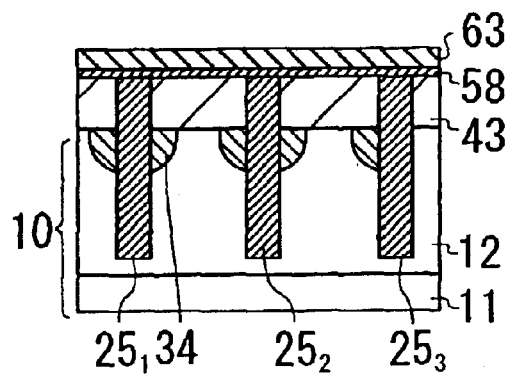
FIG. 22(b) is a 20th sectional view for illustrating the manufacturing step of a portion corresponding to a cross section taken along the line B—B in FIG. 1.

Next, when a thermal treatment is treated, the high-concentration injected regions 60 of the second conductivity type and the injected regions 61 of the first conductivity type are diffused by heat to form ohmic regions 65 of the second conductivity type and source regions 66 of the first conductivity type, respectively, as shown in FIGS. 22(a) and 22(b).

Figure 23A:
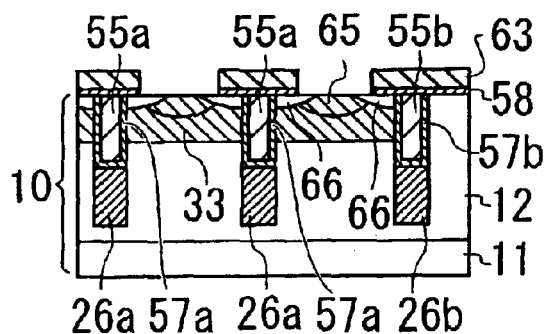
FIG. 23(a) is a 21st sectional view for illustrating a manufacturing step of a portion corresponding to a cross section taken along the line A—A in FIG. 1.
Figure 23B:
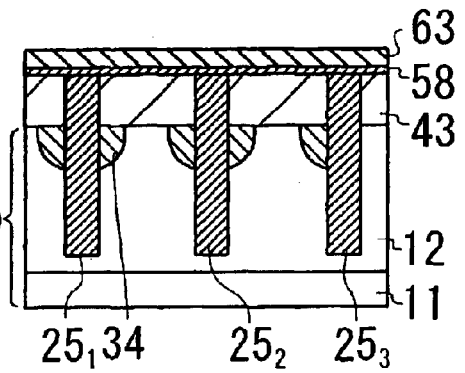
FIG. 23(b) is a 21st sectional view for illustrating the manufacturing step of a portion corresponding to a cross section taken along the line B—B in FIG. 1.

Subsequently, as shown in FIGS. 23(a) and 23(b), the PSG film 63 and the underlayer oxide film 58 are patterned so as to expose a part of the source region 66 and the ohmic region 65.

Figure 24A:
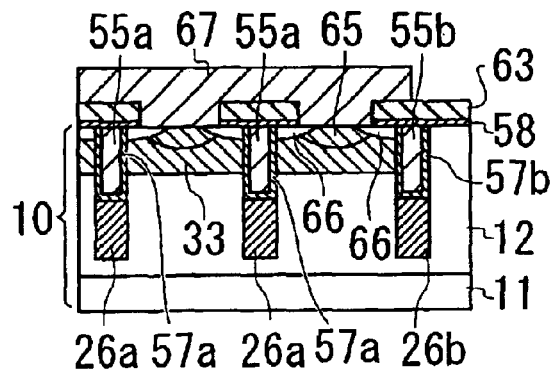
FIG. 24(a) is a 22nd sectional view for illustrating a manufacturing step of a portion corresponding to a cross section taken along the line A—A in FIG. 1.
Figure 24B:
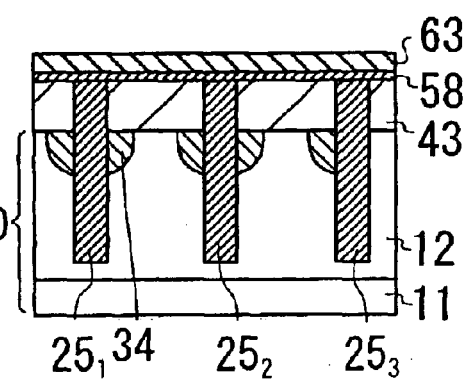
FIG. 24(b) is a 22nd sectional view for illustrating the manufacturing step of a portion corresponding to a cross section taken along the line B—B in FIG. 1.

Next, after formation of a metal film made of aluminum or the like on the entire surface, the metal film is patterned so as to form a source electrode film 67 as shown in FIGS. 24(a) and 24(b). The source electrode film 67 is formed in a rectangular shape-and has the edge situated on the ring-shaped gate electrode plug 55b.

Figure 25A:
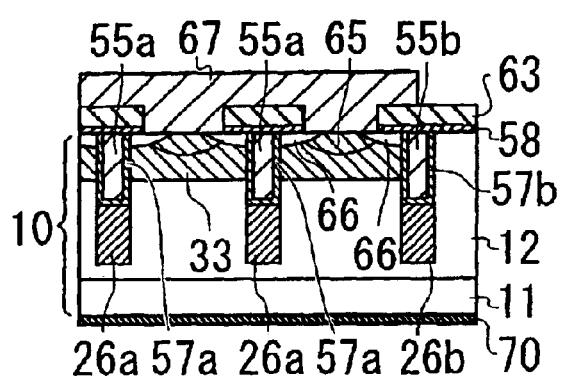
FIG. 25(a) is a 23rd sectional view for illustrating a manufacturing step of a portion corresponding to a cross section taken along the line A—A in FIG. 1.
Figure 25B:
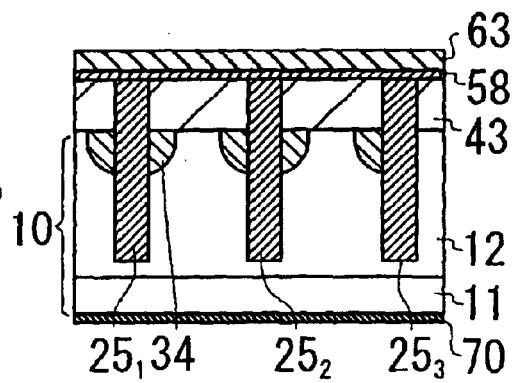
FIG. 25(b) is a 23rd sectional view for illustrating the manufacturing step of a portion corresponding to a cross section taken along the line B—B in FIG. 1.

Thereafter, on the surface of the processed substrate 10, which is opposite to the face where the source electrode film 67 is formed as shown in FIGS. 25(a) and 25(b), a metal film made of, for example, chromium is formed as a drain electrode film 70. Through the above-described steps, the transistor 1 as shown in FIGS. 1, 2(a), and 2(b) according to one embodiment of the present invention is completed.

In the thus formed transistor 1, the lower ends of the buried regions 26a and 26b are situated at the same height as the lower ends of the filling regions $25_1$ to $25_3$. However, the upper ends of the filling regions $25_1$ to $25_3$ are positioned higher than the upper end of buried regions 26a and 26b. For the buried regions 26a, 26b and filling regions $25_1$ to $25_3$, to compare the area in contact with the drain layer where the depletion layer is expended, the area for each of the filling regions $25_1$ to $25_3$ is larger than the area for each of the buried regions 26a and 26b.

Moreover, the upper portions of the filling regions $25_1$ to $25_3$ are situated within the second shallow holes $82_1$ to $82_3$ formed through the insulating film 43. Therefore, as compared with the case where the upper ends of the filling regions $25_1$ to $25_3$ have the same height as that of the surface of the processed substrate 10, the amount of the filling regions $25_1$ to $25_3$ is increased by a volume of a part situated within each of the second shallow holes $82_1$ to $82_3$. A withstanding voltage becomes higher as compared with the case where the upper edges of the filling regions $25_1$ to $25_3$ have the same height as that of the surface of the substrate 10 because the depletion layer is also expanded into the filling regions $25_1$ to $25_3$ positioned within the second shallow holes $82_1$ to $82_3$.

In such a transistor 1, when a positive voltage equal to or larger than a threshold voltage is applied to the gate electrode plugs 55a and 55b in the state where both the source electrode film 67 and the base region 33 are connected to a ground potential while a positive voltage is being applied to the drain electrode film 70, an inversion layer of the first conductivity type is formed in a channel region (an interface between the base region 33 and the gate insulating film 57). Then, the source regions 66 and the drain layer 12 are connected to each other through the inversion layer, so that a current is allowed to flow from the drain layer 12 to the source regions 66. In this condition, the transistor 1 is in a conductive state.

The potential of each of the gate electrode plugs 55a and 55b is set at the same potential as the source regions 66 in such a condition, the inversion layer disappears so that a current is not passed. In this condition, the transistor 1 is in a cutoff state.

When the transistor 1 is in a cutoff state and the PN junctions formed by the base regions 33 and the drain layer 12 are reverse biased, a depletion layer is expanded into the base regions 33 of the second conductivity type and the drain layer 12 of the first conductivity type. Since the base regions 33 have a higher concentration than the drain layer 12, the depletion layer is mainly expanded into the drain layer 12.

When the depletion layer is downward expanded from the PN junctions between the base regions 33 and the drain layer 12 to reach the buried regions 26a and 26b, the depletion layer is further expanded into the buried regions 26a and 26b.

When the depletion layer reaches the buried regions 26a and 26b, the potential of the buried regions 26a and 26b becomes constant. As a result, the depletion layer begins to expand from the buried regions 26a and 26b toward the drain layer 12. When the depletion layers expanding from the adjacent buried regions 26a and 26b toward the drain layer 12 get in contact with each other, the buried regions 26a and 26b and the drain layer 12 between buried regions 26a and 26b are entirely depleted.

On the other hand, when the horizontally expanded depletion layer reaches the filling regions $25_1$ to $25_3$, the depletion layer is also expanded into the filling regions $25_1$ to $25_3$. The depletion layer is further expanded from the filling regions $25_1$ to $25_3$ into the drain layer 12.

The drain layer 12 between the adjacent filling regions $25_1$ to $25_3$ and the drain layer between the filling region $25_1$ at the innermost circumference and the buried region 26b in the ring-shaped groove is also depleted.

If a voltage higher than this situation is applied, the depletion layer is further expanded in a downward direction from the buried regions 26a and 26b and the filling regions $25_1$ to $25_3$.

As described above, the area of a portion in contact with the drain layer 12 is larger for each of the filling regions $25_1$ to $25_3$ than for each of the buried regions 26a and 26b. When the base region 33 including the vicinity area assume an active region and each of the filling regions $25_1$ to $25_3$ assume withstanding voltage region, an avalanche withstanding voltage of the withstanding voltage region is higher than an avalanche withstanding voltage of the active region.

Thus, avalanche breakdown occurs earlier in the active region than in the portion where each of the filling regions $25_1$ to $25_3$ is provided. At this moment, a current is allowed to flow not through the portion where each of the filling regions $25_1$ to $25_3$ is provided, but through the active region. However, current concentration does not occur because a current path is fixed in the active region. Accordingly, an element is unlikely to be broken down due to the current concentration.

In this embodiment, the relay diffusion region 34 made of a shallow impurity diffusion layer of second conductivity type is provided inside the inner circumference of the ring of each of the filling regions $25_1$ to $25_3$ and outside of outer circumference of the ring of each of the filling regions $25_1$ to $25_2$. Herein, each relay diffusion region 34 is placed so as to be in direct contact with the inner circumference of the ring of each of the filling regions $25_1$ to $25_3$ and the outer circumference of the ring of each of the filling regions $25_1$ to $25_2$.

A width of the epitaxial layer 12 interposed between the adjacent filling regions $25_1$ to $25_3$ is shorter in a portion where the relay diffusion region 34 is provided than in a portion where the relay diffusion region 34 is not provided. If the depletion layer is expanded from each of the filling regions $25_1$ to $25_3$, a portion where the width of the drain layer 12 is shorter is depleted earlier than a portion where the width of the drain layer is longer. Therefore, the portions where the relay diffusion regions 34 are provided are depleted at a voltage lower than a voltage at which the portion where the relay diffusion region 34 is absent is depleted. Therefore, the potential state of the filling regions $25_1$ to $25_3$ which have been in a floating potential state can be quickly stabilized. Although these relay diffusion regions 34 are partially positioned at the inner circumferences and outer circumferences of the rings, the relay diffusion regions 34 may also be provided on the entire inner circumferences or outer circumferences of the rings. Alternatively, the relay diffusion regions 34 may be omitted.

Moreover, although a MOSFET is constituted as a transistor in the above-described embodiment, a transistor of the present invention is not limited thereto. For example, an IGBT (Insulated Gate Bipolar Transistor), which can be obtained by forming a drain layer of the first conductivity type on semiconductor of the second conductivity type, may alternatively be constituted as a transistor of the present invention.

The IGBT type transistors can be classified into two types; a PN junction IGBT type transistor and a Schottky junction IGBT type transistor.

Figure 28A:
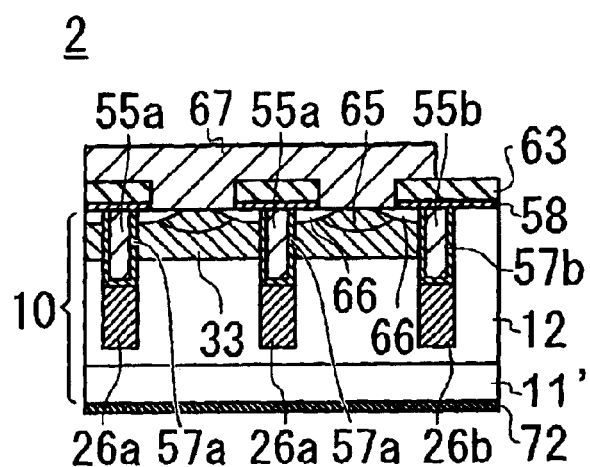
FIGS. 28(a) and 28(b) are sectional views, each illustrating a diffusion structure of an example of a PN junction type IGBT according to the present invention.
Figure 28B:
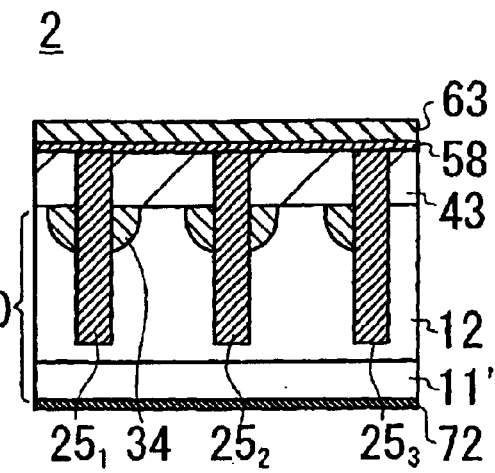

The reference numeral 2 in FIGS. 28(a) and 28(b) denotes a PN junction IGBT type transistor according to the present invention.

This transistor 2 has the same structure as that of the transistor 1 of the above-described embodiment except that the drain layer 12 is placed on a collector layer 11' of the second conductivity type which is opposite to the conductivity type of the drain layer 12.

The collector 11' forms a PN junction with the drain layer 12. When the transistor 2 is brought into a conductive state, the PN junction is forward biased, so that minority carriers are injected into the drain layer 12 from the collector layer 11' to lower a conductive resistance.

The reference numeral 72 in FIGS. 28(a) and 28(b) denotes a collector electrode film that forms an ohmic junction with the collector layer 11'.

Figure 29A:
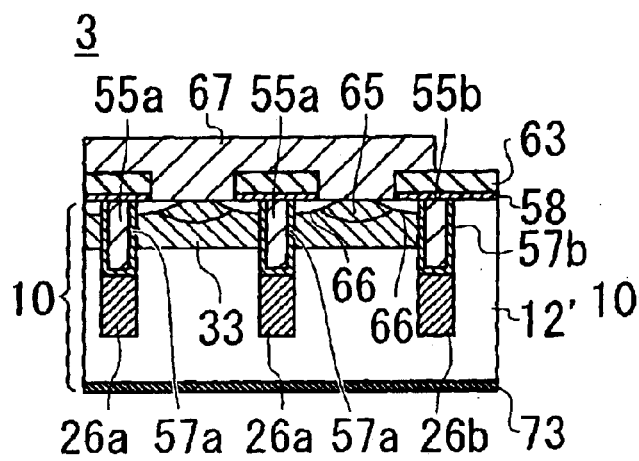
FIGS. 29(a) and 29(b) are sectional views, each illustrating a diffusion structure of an example of a Schottky junction type IGBT according to the present invention.
Figure 29B:
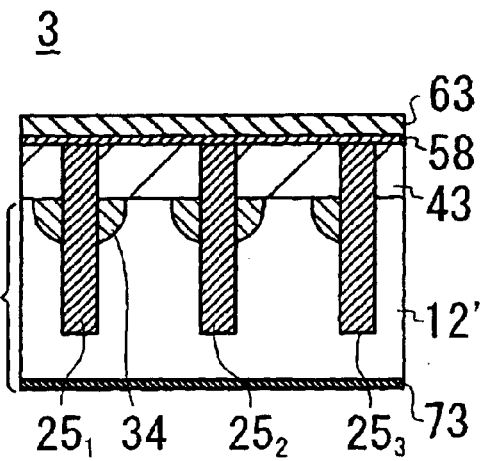

Next, the reference numeral 3 in FIGS. 29(a) and 29(b) denotes a Schottky junction IGBT type transistor according to the present invention. The reference numeral 12' denotes a low concentration layer of the first conductivity type.

In this transistor 3, the back face of the processed substrate 10 is abraded to expose the surface of the low concentration layer 12'. A Schottky electrode film 73 is formed on the exposed surface of the low concentration layer 12'.

A portion of the Schottky electrode film 73 in contact with the low concentration layer 12' is made of chromium or the like. A Schottky junction is formed between the low concentration layer 12' and the Schottky electrode film 73.

The polarity of the Schottky junction is forward biased when the transistor 3 is brought into a conductive state. The Schottky junction is forward biased, so that minority carriers are injected into the low concentration layer 12' from the Schottky electrode film 73 to lower a conductive resistance.

Figure 30:
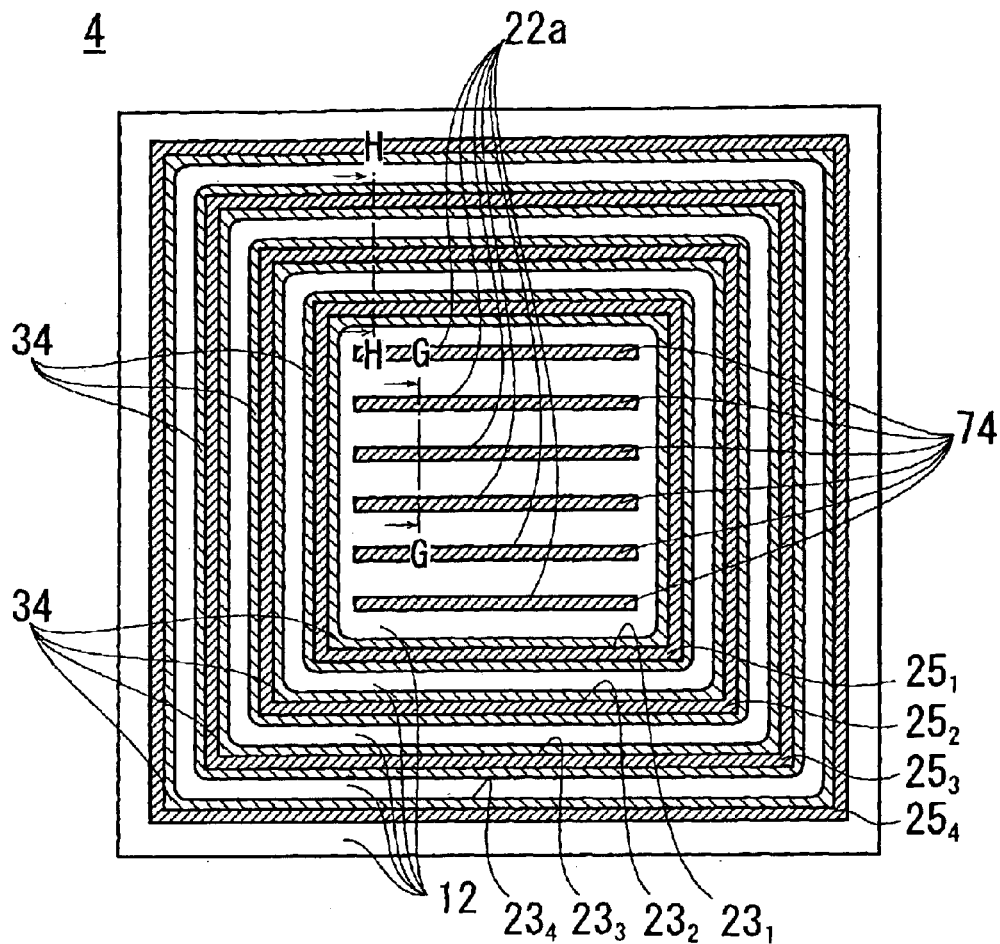
FIG. 30 is a plan view for illustrating a diffusion structure of an example of a diode according to the present invention.

Next, FIG. 30 is a plan view showing a diffusion structure of an example of a diode 4 according to the present invention.

In this diode 4, a plurality of first deep holes 22a and a plurality of ring-shaped second deep holes $23_1$ to $23_4$ concentrically surrounding the first deep holes 22a are formed in the first low concentration layer 13 of the first conductivity type.

Figure 31A:
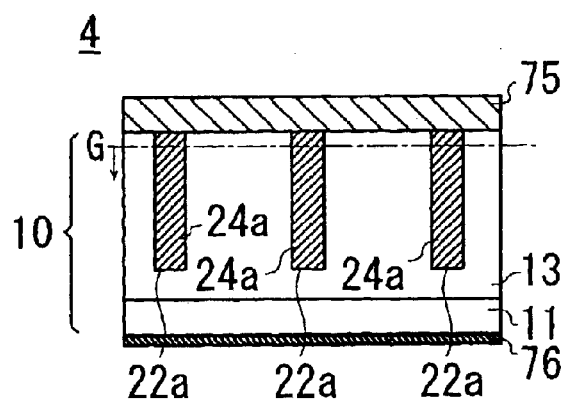
FIGS. 31(a) and 31(b) are sectional views, each illustrating a diffusion structure of an example of a diode according to the present invention.
Figure 31B:
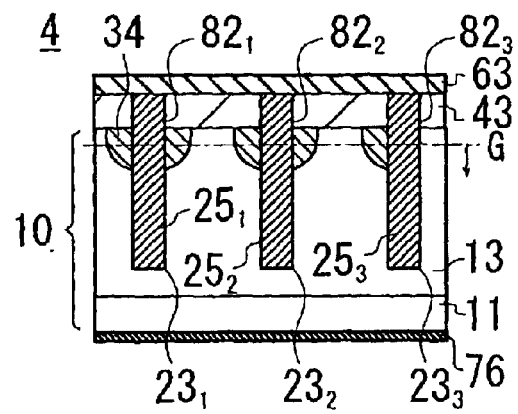
Figure 32:
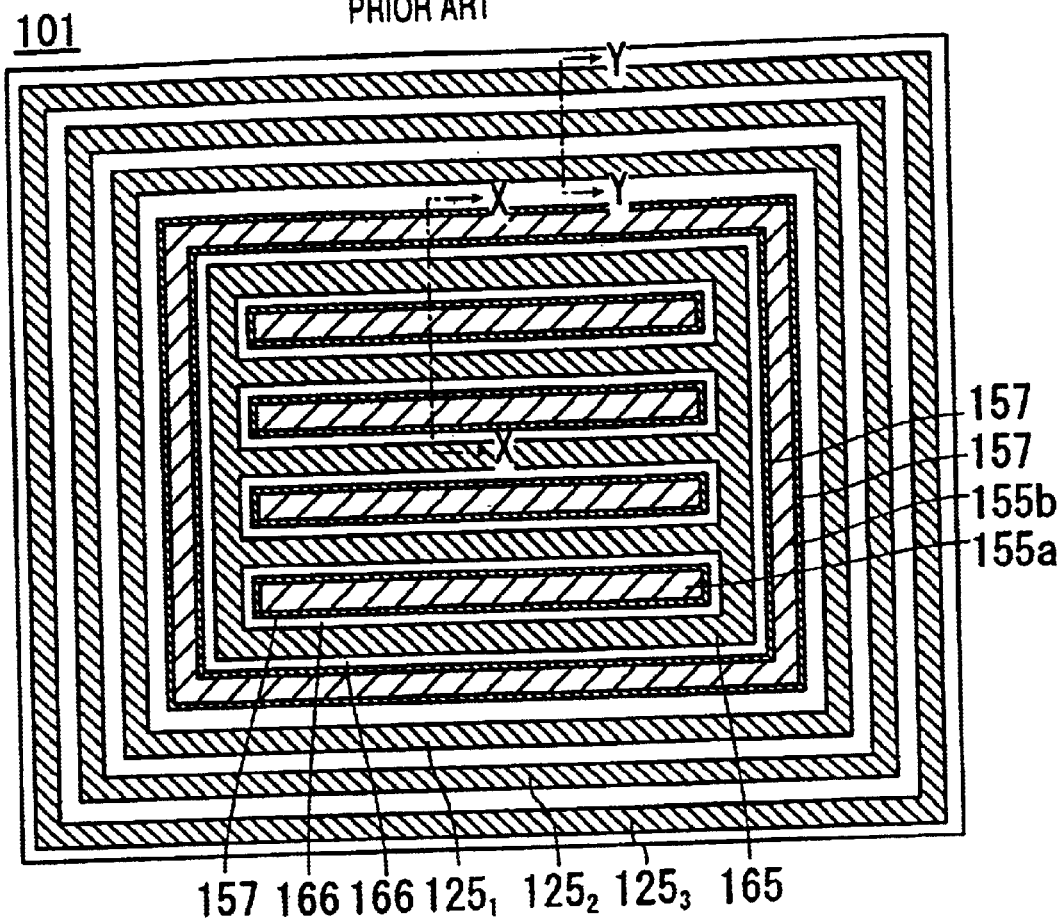
FIG. 32 is a sectional view of a conventional transistor showing a substrate taken along a plane across a source region and parallel to its surface.
Figure 33A:
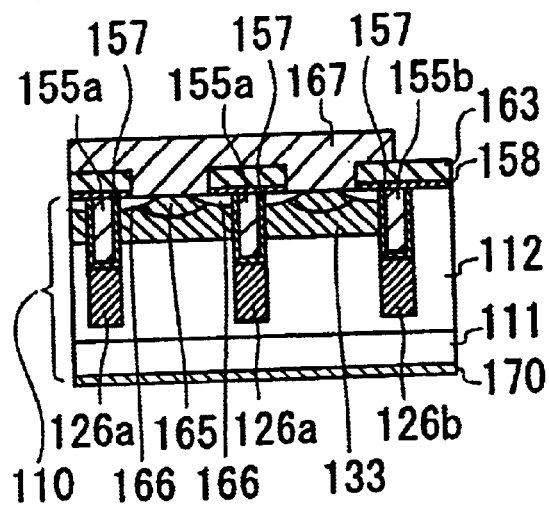
FIG. 33(a) is a sectional view taken along the line X—X in FIG. 32.
Figure 33B:
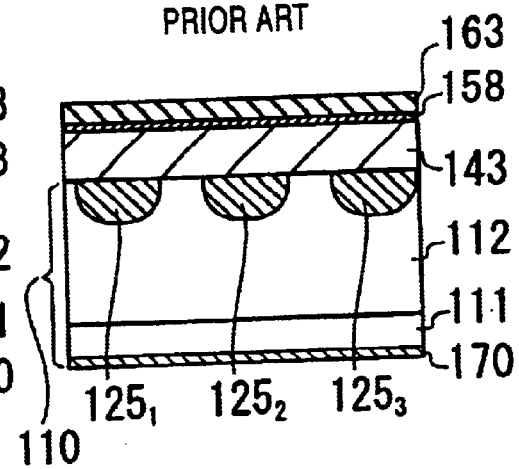
FIG. 33(b) is a sectional view taken along the line Y—Y in FIG. 32.

FIG. 31(a) is a sectional view taken along the line G—G in FIG. 30, and FIG. 31(b) is a sectional view taken along the line H—H in FIG. 30.

In the first and second deep holes 22a and $23_1$ to $23_4$, first and second filling regions 24a and $25_1$ to $25_4$ of the second conductivity type, which are made of silicon single crystal formed by epitaxial growth, are placed.

The upper portions of the first filling regions 24a have the same height as that of the low concentration layer 13. A Schottky electrode film 75 is formed on the surface of the low concentration layer 13 exposed between the first filling regions 24a and on the surfaces of the first filling regions 24a.

At least a part of the Schottky electrode film 75 in contact with the low concentration layer 13 and the first filling regions 24a is a material of which forming a Schottky junction with the low concentration layer 13 while forming ohmic junctions with the first filling regions 24a.

In a region surrounding the regions where the first deep holes 22a are situated, an insulating film 43 having shallow holes $82_1$ to $82_4$ above the second deep holes $23_1$ to $23_4$ is placed.

The second filling regions $25_1$ to $25_4$ are also formed within the shallow holes $82_1$ to $82_4$ so that the upper portions of the second filling regions $25_1$ to $25_4$ have the same height as that of the insulating film 43.

The low concentration layer 13 is formed on one face of the single crystalline substrate 11 of the first conductivity type by epitaxial growth. On the opposite face of the single crystalline substrate 11, a back face electrode 76 forming an ohmic junction with the single crystalline substrate 11 is formed.

Each of the second filling regions $25_1$ to $25_4$ has a ring shape. The relay diffusion region 34 of the second conductivity type is placed only on the inner circumferential side or on both the inner circumferential side and the outer circumferential side of each of the second filling regions $25_1$ to $25_4$. Herein, each of the relay diffusion regions 34 has a ring shape. Each of the relay diffusion regions 34 situated between the second filling regions $25_1$ to $25_4$ is in contact with any one of the adjacent second filling regions $25_1$ to $25_4$ and is not in contact with both adjacent second filling regions $25_1$ to $25_4$.

The Schottky electrode film 75 is not in contact with the second filling regions $25_1$ to $25_4$. Therefore, the second filling regions $25_1$ to $25_4$ are electrically separated from each other.

The reference numeral 63 in FIG. 31(b) is a protection film made of an insulating film such as a silicon oxide film. The upper portions of the second filling regions $25_1$ to $25_4$ are covered with the protection film 63.

The Schottky junction between the low concentration layer 13 and the Schottky electrode film 75 has such a polarity that is forward biased when a positive voltage is applied using the Schottky electrode film 75 as an anode electrode and a negative voltage is applied using the back face electrode 76 as a cathode electrode. A voltage which allows the Schottky junction to be forward biased also allows the PN junction formed between the first filling region 24a and the low concentration layer 13 to be forward biased.

However, a voltage that forward biases the PN junction to allow a current to flow thereacross is larger than a voltage that forward biases the Schottky junction to allow a current to flow thereacross. Therefore, a current flows only across the Schottky junction between the Schottky electrode film 75 and the back face electrode 76.

On the contrary, when a negative voltage is applied to the Schottky electrode film 75 while a positive voltage is applied to the back face electrode 76, the Schottky junction and the PN junction are both reverse biased so that a current is not passed.

In this state, the depletion layer is expanded into the low concentration layer 13 from the Schottky junction between the Schottky electrode film 75 and the low concentration layer 13 and the PN junctions between the first filling regions 24a and the low concentration layer 13.

When the depletion layer reaches the second filling regions $25_1$ to $25_4$ or the relay diffusion regions 34, the depletion layer is further expanded outward from the second filling regions $25_1$ to $25_4$ or from the relay diffusion regions 34.

Herein, similarly to the above-described transistors 1 to 3, the second filling regions $25_1$ to $25_4$ also fill the shallow holes $82_1$ to $82_4$ formed in the insulating layer 43 in the diode 4 according to the present invention. Since the depletion layer is expanded into the second filling regions $25_1$ to $25_4$ filling the shallow holes $82_1$ to $82_4$, a withstanding voltage of the peripheral area of the first filling region 24a is higher than that of the first filling region 24a. As a result, higher reliability is provided.

In this diode 4, the Schottky electrode film 75 serves as an anode electrode, whereas the back face electrode 76 serves as a cathode electrode. However, the diode according to the present invention includes the case where the Schottky electrode film 75 serves as a cathode electrode, whereas the back face electrode 76 serves as an anode electrode.

Furthermore, in the above-described transistors 1 to 3 and diode 4, the first conductivity type is n-type and the second conductivity type is p-type. On the contrary, the present invention includes a transistor or a diode, having a p-type as a first conductivity type and an n-type as a second conductivity type.

Moreover, semiconductor of the present invention is not limited to silicon; other semiconductor such as Ge or compound semiconductor such as GaAs is also included in the semiconductor of the present invention.

A transistor, in which a withstanding voltage of a guard ring is higher than that of an active region, can be obtained by the present invention.

What is claimed is:

1. A transistor comprising:
   a processed substrate including a drain layer of a first conductivity type provided on one face thereof, the processed substrate having a plurality of first deep holes provided on the drain layer side and a plurality of ring-shaped second deep holes provided so as to concentrically surround the plurality of first deep holes;
   a gate insulating film provided on at least a part of a side face of each of the first deep holes;
   gate electrode plugs provided in the first deep holes and being in contact with the gate insulating film;
   a base region of a second conductivity type, provided at a position in contact with the gate insulating film inside the drain layer, having a shallower bottom face than each of the first deep holes; and
   a source region of a first conductivity type provided at inner surface of the base region to be contact with the gate insulating film, the source region not being in contact with the drain layer due to the base region,
   wherein, when a voltage is applied to the gate electrode plugs to invert a conductivity type of a portion of the base region in contact with the gate insulating film into the first conductivity type so as to form an inversion layer, the source region and the drain layer positioned below a bottom face of the base region are connected to each other through the inversion layer; and
   filling regions of the second conductivity type are provided in the second deep holes.

2. The transistor according to claim 1, wherein
   an insulating film is provided on the processed substrate;
   second shallow holes having a same planar shape as that of the second deep holes are provided above the second deep holes in the insulating film; and
   the filling regions are provided in the second deep holes and the second shallow holes.

3. The transistor according to claim 1, wherein
   buried regions made of a semiconductor of the second conductivity type are provided in the first deep holes at positions below the gate electrode plugs while being insulated from the gate electrode plugs.

4. The transistor according to claim 3, wherein
   a length of the filling regions in a depth direction is larger than a length of the buried regions in a depth direction.

5. The transistor according to claim 3, wherein
   the semiconductor of the second conductivity type constituting the filling regions and the buried regions are formed at a same fabrication step.

6. The transistor according to claim 1, wherein
   a relay diffusion region formed by a diffusion region of the second conductivity type, being shallower than each of the filling regions, is provided between the filling regions.

7. The transistor according to claim 1, wherein
   the second deep holes are formed by etching at the same etching step as the first deep holes.

8. A diode comprising:
   a processed substrate including a low concentration layer of a first conductivity type formed on one face thereof, the processed substrate having a plurality of first deep holes provided on its low concentration layer side and a plurality of ring-shaped second deep holes provided so as to concentrically surround the plurality of first deep holes;
   first filling regions of a second conductivity type provided in the first deep holes; and
   a Schottky electrode provided in contact with the low concentration layer and the first filling regions, the Schottky electrode forming a Schottky junction with the low concentration layer while forming an ohmic junction with each of the first filling regions,
   wherein the second filling regions of the second conductivity type are provided in the second deep holes, and
   the Schottky electrode is not in contact with the second filling regions.

9. The diode according to claim 8, comprising an insulating film including shallow holes above the second deep holes, wherein the second filling regions are provided in the second deep holes and the shallow holes.

10. The diode according to claim 8, wherein
    a relay diffusion region consisting of a diffusion region of the second conductivity type, being shallower than the first and second filling regions, is provided between the second filling regions.

* * * * *